United States Patent
Iwayama

(10) Patent No.: US 11,875,834 B2
(45) Date of Patent: Jan. 16, 2024

(54) MAGNETIC MEMORY DEVICE AND MEMORY SYSTEM

(71) Applicant: Kioxia Corporation, Tokyo (JP)

(72) Inventor: Masayoshi Iwayama, Seoul (KR)

(73) Assignee: Kioxia Corporation, Tokyo (JP)

( * ) Notice: Subject to any disclaimer, the term of this patent is extended or adjusted under 35 U.S.C. 154(b) by 218 days.

(21) Appl. No.: 17/465,080

(22) Filed: Sep. 2, 2021

(65) Prior Publication Data

US 2022/0084574 A1 Mar. 17, 2022

(30) Foreign Application Priority Data

Sep. 17, 2020 (JP) ................. 2020-156432

(51) Int. Cl.
*G11C 11/16* (2006.01)
*G06F 13/40* (2006.01)
*H10B 61/00* (2023.01)

(52) U.S. Cl.
CPC ........ *G11C 11/161* (2013.01); *G06F 13/4027* (2013.01); *G11C 11/1655* (2013.01); *G11C 11/1657* (2013.01); *G11C 11/1659* (2013.01); *H10B 61/10* (2023.02)

(58) Field of Classification Search
CPC ............ G11C 11/161; G11C 11/1655; G11C 11/1657; G11C 11/1659; G11C 2029/5006; G11C 11/1675; G11C 29/02; G11C 29/50; G11C 29/70; G11C 2029/0409; G11C 11/15; G06F 13/4027; H10B 61/10; Y02D 10/00
USPC ......................................... 711/104; 365/158
See application file for complete search history.

(56) References Cited

U.S. PATENT DOCUMENTS

| | | | |
|---|---|---|---|
| 3,686,894 A * | 8/1972 | Handler | A44C 25/002 63/19 |
| 6,594,171 B1 | 7/2003 | Hogan | |
| 6,762,952 B2 | 7/2004 | Munden et al. | |
| 6,885,582 B2 * | 4/2005 | Sharma | G11B 5/74 365/158 |
| 6,999,366 B2 | 2/2006 | Perner et al. | |
| 9,728,240 B2 * | 8/2017 | Abedifard | G11C 11/1677 |
| 9,767,878 B1 * | 9/2017 | Chih | G11C 11/1673 |
| 10,236,075 B1 | 3/2019 | Kim et al. | |
| 10,707,269 B2 | 7/2020 | Nagase et al. | |
| 10,714,198 B1 * | 7/2020 | Yang | G11C 16/08 |

(Continued)

FOREIGN PATENT DOCUMENTS

| | | | | |
|---|---|---|---|---|
| EP | 1321941 A1 * | 6/2003 | ............ | B82Y 10/00 |
| JP | 2004030884 A | 1/2004 | | |

(Continued)

OTHER PUBLICATIONS

Avalanche Technology Granted Patent for Pulse Programming Techniques for Voltage-Controlled Magnetoresistive Tunnel Junction (MTJ), Aug. 8, 2017, Global IP News (Year: 2017).*

*Primary Examiner* — Michael T Tran
(74) *Attorney, Agent, or Firm* — Holtz, Holtz & Volek PC

(57) ABSTRACT

According to one embodiment, a magnetic memory device includes a first memory cell and a control circuit. The first memory cell includes a first magnetoresistance effect element and a first switching element coupled in series. The control circuit is configured to repeatedly apply a first voltage to the first memory cell until a first condition is satisfied in a first operation.

16 Claims, 16 Drawing Sheets

(56) References Cited

U.S. PATENT DOCUMENTS

| | | | |
|---|---|---|---|
| 10,839,928 B1 * | 11/2020 | Yang | G11C 16/26 |
| 2002/0051381 A1 * | 5/2002 | Numata | G11C 11/15 |
| | | | 365/158 |
| 2003/0090934 A1 * | 5/2003 | Iwata | G11C 11/16 |
| | | | 365/158 |
| 2003/0117834 A1 * | 6/2003 | Iwata | G11C 11/1659 |
| | | | 365/158 |
| 2016/0155515 A1 * | 6/2016 | Son | G11C 11/1673 |
| | | | 714/719 |
| 2017/0263336 A1 | 9/2017 | Nakayama et al. | |
| 2018/0144782 A1 * | 5/2018 | Noguchi | H10B 61/22 |
| 2019/0206716 A1 * | 7/2019 | Kim | H01L 29/7827 |
| 2020/0066968 A1 * | 2/2020 | Park | H10N 50/85 |
| 2020/0365795 A1 * | 11/2020 | Chuang | H10N 50/01 |
| 2022/0084574 A1 * | 3/2022 | Iwayama | G11C 11/1675 |

FOREIGN PATENT DOCUMENTS

| | | | | |
|---|---|---|---|---|
| JP | 2005166251 A | 6/2005 | | |
| JP | 4303006 B2 | 5/2009 | | |
| JP | 2020043131 A | 3/2020 | | |
| WO | WO-03096422 A1 * | 11/2003 | | B82Y 10/00 |

\* cited by examiner

| Address information on defective memory cell | Address information on word line WL coupled to defective memory cell | Address information on bit line BL coupled to defective memory cell |
|---|---|---|
| ⟨3,5,7⟩ | ⟨4,5⟩ | ⟨3,7⟩ |
| ⟨6,8,9⟩ | ⟨6,8⟩ | ⟨7,9⟩ |
| ... | ... | ... |

F I G. 6

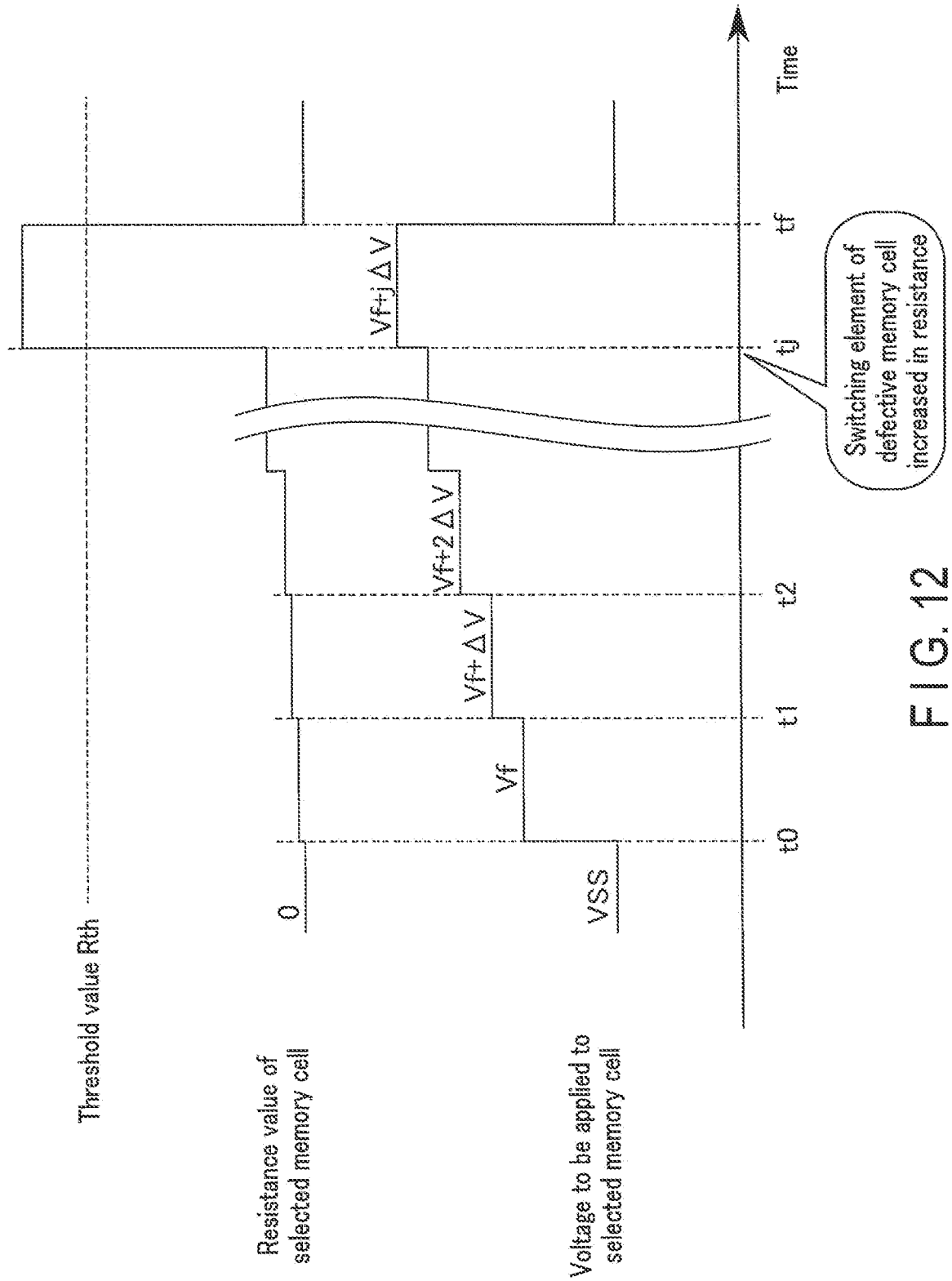
F I G. 12

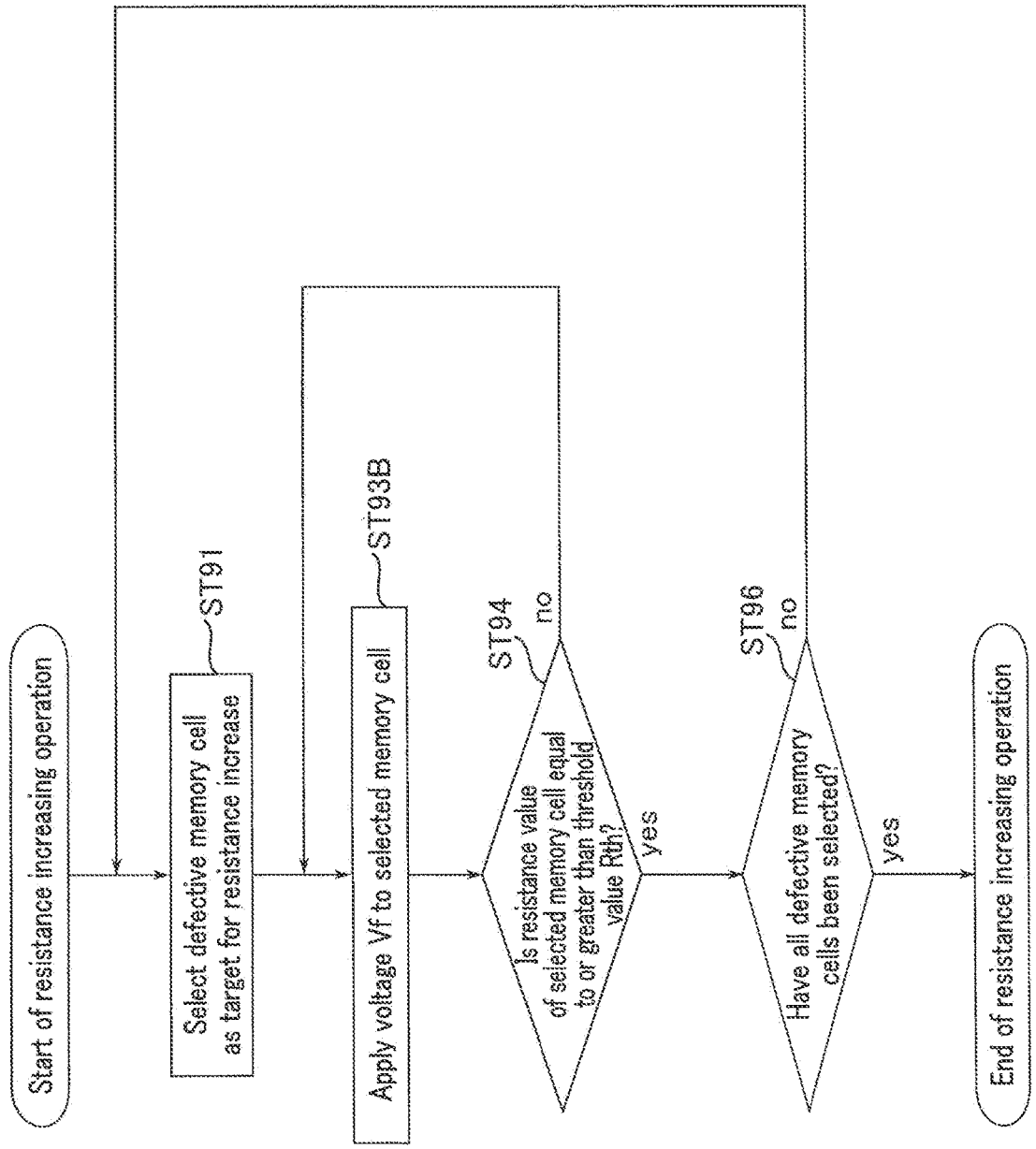
F I G. 16

MAGNETIC MEMORY DEVICE AND MEMORY SYSTEM

CROSS-REFERENCE TO RELATED APPLICATIONS

This application is based upon and claims the benefit of priority from Japanese Patent Application No. 2020-156432, filed Sep. 17, 2020, the entire contents of which are incorporated herein by reference.

FIELD

Embodiments described herein relate generally to a magnetic memory device and a memory system.

BACKGROUND

A memory system including a magnetic memory device (magnetoresistive random access memory (MRAM)) and a memory controller is known. The magnetic memory device adopts a magnetoresistance effect element as a memory element. The memory controller controls the magnetic memory device.

BRIEF DESCRIPTION OF THE DRAWINGS

FIG. 6 is a conceptual diagram illustrating a defective memory cell table stored in the memory system including the magnetic memory device according to the embodiment.

FIG. 12 is a timing chart illustrating the resistance increasing operation in the magnetic memory device according to the embodiment.

FIG. 16 is a flowchart illustrating a resistance increasing operation in a magnetic memory device according to a second modification of the embodiment.

DETAILED DESCRIPTION

Figure 1:
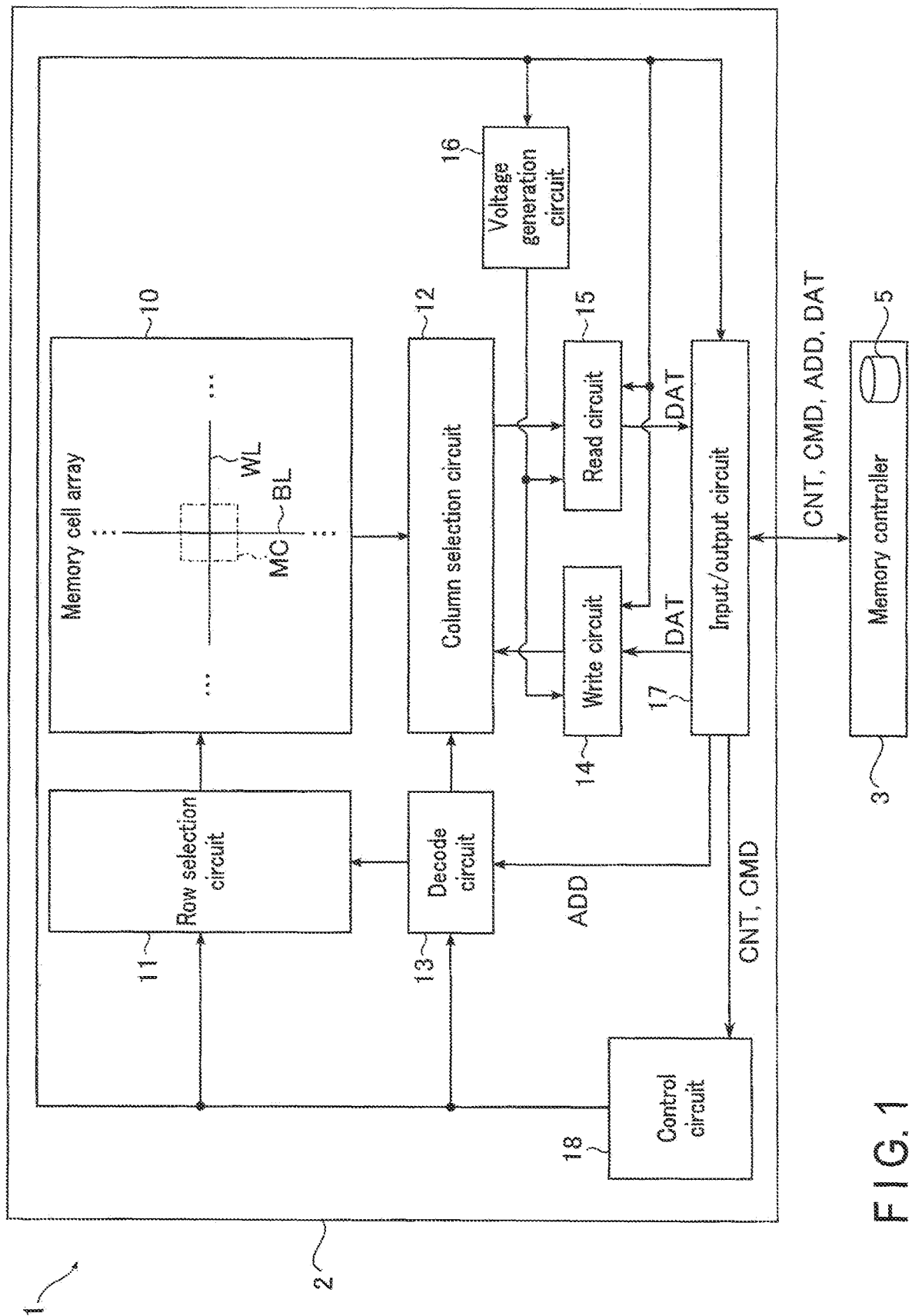
FIG. 1 is a block diagram illustrating a configuration of a memory system including a magnetic memory device according to an embodiment.

In general, according to one embodiment, a magnetic memory device includes first memory cell and a control circuit. The first memory cell includes a first magnetoresistance effect element and a first switching element coupled in series. The control circuit is configured to repeatedly apply a first voltage to the first memory cell until a first condition is satisfied in a first operation.

Hereinafter, embodiments will be described with reference to the drawings. In the following description, constituent elements having the same function and configuration will be assigned common reference numerals. If it is necessary to distinguish structural elements having the same reference symbols from each other, an additional symbol is added after the reference symbol. If it is unnecessary to distinguish the structural elements only a common reference symbol is assigned to the structural elements, and no additional symbol is added. Herein, additional symbols are not limited to subscripts or superscripts, and they may be lower-case alphabetical letters added to references symbols, and indices that indicate an array.

1. Embodiment

A magnetic memory device according to an embodiment will be described. Examples of the magnetic memory device according to the embodiment include a magnetic memory device of a perpendicular magnetic recording type which uses, as a resistance change element, an element (MTJ element) that exhibits a magnetoresistance effect through a magnetic tunnel junction (MTJ). The MTJ element may be referred to as a "magnetoresistance effect element". In the following embodiments including the present embodiment, a case where an MTJ element is adopted as a magnetoresistance effect element will be described. For convenience of description, the MTJ element will be referred to as a "magnetoresistance effect element MTJ".

1.1. Configuration

First, a configuration of a magnetic memory device according to an embodiment will be described.

1.1.1 Memory System

FIG. 1 is a block diagram illustrating a configuration of a memory system including the magnetic memory device according to the embodiment.

As shown in FIG. 1, a memory system 1 includes a magnetic memory device 2 and a memory controller 3. The magnetic memory device 2 contains a plurality of memory cells MC each configured to store data in a nonvolatile manner. The memory controller 3 controls the magnetic memory device 2. The memory system 1 is connected to a host device (not shown) such as a processor, etc.

The memory controller 3 communicates control signals CNT with the magnetic memory device 2, and orders the magnetic memory device 2 to perform an access operation (for example, a data write operation, a data read operation, etc.) with respect to each memory cell MC within the magnetic memory device 2. When these operations are executed, the memory controller 3 issues each command CMD corresponding to each operation, and sends to the magnetic memory device 2 a command CMD and an address ADD of a target for a corresponding operation. The address ADD is information with which one of the memory cells MC can be specified. For example, the address ADD includes a layer address, a row address, and a column address.

For example, when a write operation is executed, the memory controller 3 sends to the magnetic memory device 2 data to be written ("write data") DAT along with a command CMD for commanding the write operation and an address ADD of a write target. When a read operation is executed, the memory controller 3 sends to the magnetic memory device 2 a command CMD for commanding the read operation and an address ADD of a read target, and receives data read out ("read data") DAT from the magnetic memory device 2.

The memory controller 3 stores a defective memory cell table 5 in, for example, an internal RAM (not shown). The defective memory cell table 5 includes information for specifying a memory cell MC determined to be defective from among a plurality of memory cells MC within the magnetic memory device 2. The defective memory cell table 5 will be described later in detail.

The magnetic memory device 2 includes a memory cell array 10, a row selection circuit 11, a column selection circuit 12, a decode circuit 13, a write circuit 14, a read circuit 15, a voltage generation circuit 16, an input/output circuit 17, and a control circuit 18.

The memory cell array 10 includes a plurality of memory cells MC each associated with a pair of a row and a column. Specifically, memory cells MC arranged in the same row are coupled to the same word line WL, and memory cells MC arranged in the same column are coupled to the same bit line BL.

The row selection circuit 11 is coupled to the memory cell array 10 via word lines WL. The row selection circuit 11 receives a decoding result of an address ADD (i.e., a layer address and a row address) supplied from the decode circuit 13. The row selection circuit 11 sets to a selected state a word line WL corresponding to a layer and a row which are determined based on the decoding result of the address ADD. Hereinafter, a word line WL set to a selected state will be referred to as a selected word line WL. Word lines WL other than the selected word line WL will be referred to as non-selected word lines WL.

The column selection circuit 12 is coupled to the memory cell array 10 via bit lines BL. The column selection circuit 12 receives a decoding result of an address ADD (i.e., a layer address and a column address) supplied from the decode circuit 13. The column selection circuit 12 sets to a selected state a bit line BL corresponding to a layer and a column which are determined based on the decoding result of the address ADD. Hereinafter, a bit line BL set to a selected state will be referred to as a selected bit line BL. Bit lines BL other than the selected bit line BL will be referred to as non-selected bit lines BL.

The decode circuit 13 decodes an address ADD received from the input/output circuit 17. The decode circuit 13 supplies a decoding result of the address ADD to the row selection circuit 11 and the column selection circuit 12. The address ADD includes addresses of a column and row to be selected.

The write circuit 14 writes data to each memory cell MC. The write circuit 14 includes, for example, a write driver (not shown).

The read circuit 15 reads data from each memory cell MC. The read circuit 15 includes, for example, a sense amplifier (not shown).

The voltage generation circuit 16 generates voltages for various operations of the memory cell array 10, using a power supply voltage provided from an outside (not shown) of the magnetic memory device 2. For example, the voltage generation circuit 16 generates various voltages required for a write operation, and outputs them to the write circuit 14. For example, the voltage generation circuit 16 generates various voltages required for a read operation, and outputs them to the read circuit 15.

The input/output circuit 17 transfers an address ADD received from the memory controller 3 to the decode circuit 13. The input/output circuit 17 also transfers a command CMD received from the memory controller 3 to the control circuit 13. The input/output circuit 17 allows the transmission and reception of various control signals CNT between the memory controller 3 and the control circuit 18. The input/output circuit 17 transfers data DAT received from the memory controller 3 to the write circuit 14, and outputs data DAT transferred from the read circuit 15 to the memory controller 3.

The control circuit 18 controls, based on control signals CNT and commands CMD, the operations of the row selection circuit 11, the column selection circuit 12, the decode circuit 13, the write circuit 14, the read circuit 15, the voltage generation circuit 16, and the input/output circuit 17 that are contained in the magnetic memory device 2.

1.1.2 Configuration of Memory Cell Array

Figure 2:
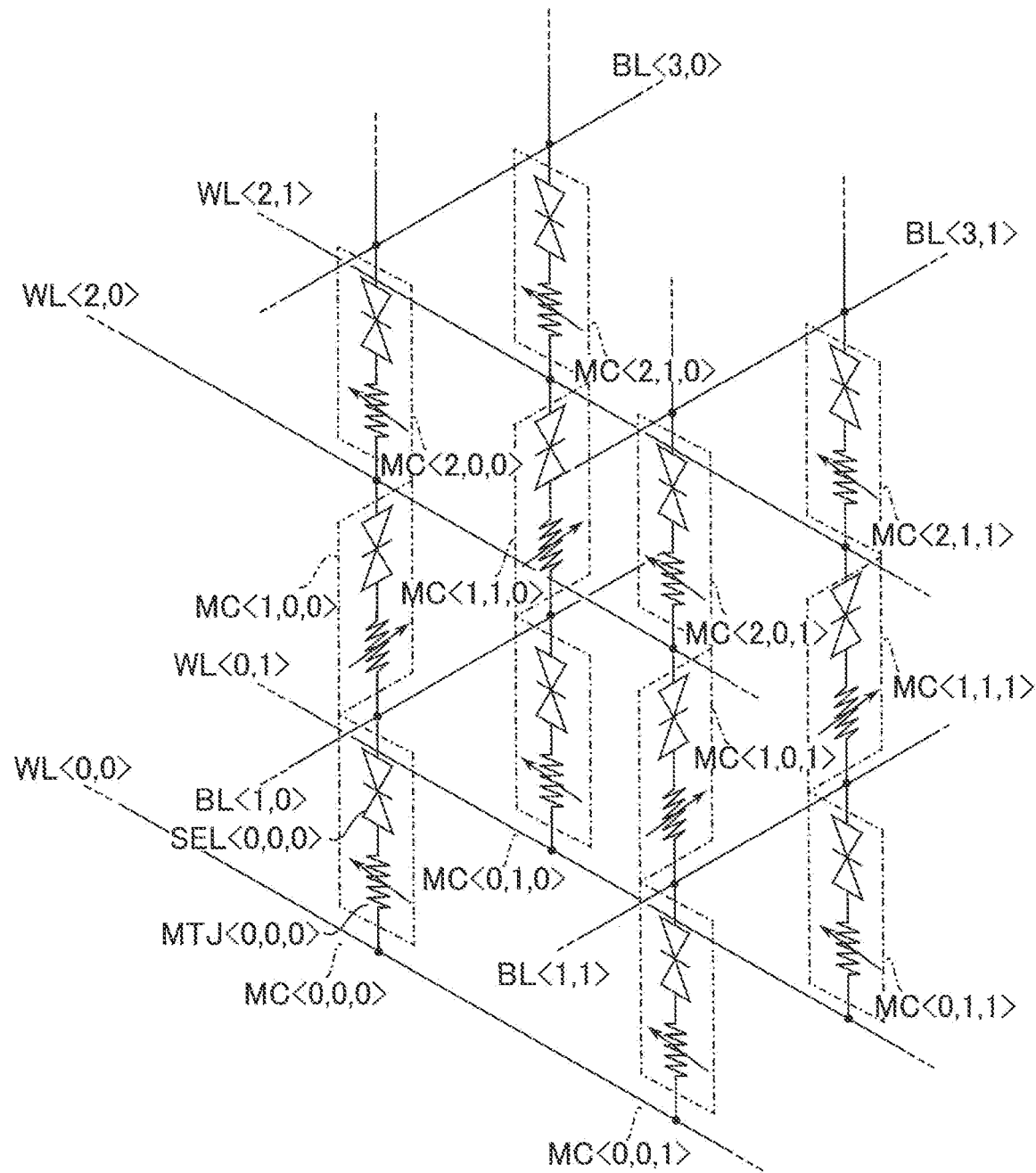
FIG. 2 is a circuit diagram illustrating a configuration of a memory cell array of the magnetic memory device according to the embodiment.

Next, a configuration of a memory cell array in the magnetic memory device according to the embodiment will be described with reference to FIG. 2. FIG. 2 is a circuit diagram showing a configuration of the memory cell array of the magnetic memory device according to the embodiment.

In the description below, each word line WL is uniquely identified with a row address m and an even-numbered layer address k, and is expressed as "WL<k,m>" using index < >. Each bit line BL is uniquely identified with a column address n and an odd-numbered layer address k, and is expressed as "BL<k,n>" using index < >. Each memory cell MC is uniquely identified with a layer address k, a row address m, and a column address n, and is expressed as "MC<k,m,n>". Herein, k, m, and n are integers respectively defined as $0 \leq k \leq K$, $0 \leq m \leq M$, and $0 \leq n \leq N$ (K, M, and N are natural numbers).

As shown in FIG. 2, the memory cells MC are arranged in a matrix pattern in the memory cell array 10. Each of the memory cells MC is associated with a set including one of the bit lines BL (BL<1,0>, BL<1,1>, . . . , BL<3,0>, BL<3,1>, . . . ) and one of the word lines WL (WL<0, 0>, WL<0,1>, . . . , WL<2,0>, WL<2,1>, . . . ), and is uniquely identified by a set including a layer address k, a row address m, and a column address n. Specifically, in a case of an even-numbered layer address k, the memory cell MC<k,m, n> is coupled between the word line WL<k,m> and the bit line BL<k+1,n>. In a case of an odd-numbered layer address k, the memory cell MC<k,m,n> is coupled between the word line WL<k+1,m> and the bit line BL<k,n>.

The memory cell MC<k,m,n> includes a switching element SEL<k,m,n> and a magnetoresistance effect element MTJ<k,m,n> coupled in series.

When data is written to and read from a magnetoresistance effect element MTJ, a corresponding switching element SEL functions as a switch that controls supply of a current to the magnetoresistance effect element MTJ. Specifically, a switching element SEL in a memory cell MC, for example, serves as an insulator having a large resistance value and interrupts a current (in other words, enters an OFF state) when a voltage applied to this memory cell MC is below a threshold voltage Vth, and serves as a conductor having a small resistance value and allows a current to flow therethrough (in other words, enters an ON state) when the voltage exceeds the threshold voltage Vth. That is, the switching element SEL has a function of switching between allowance and interruption of a current flow according to the magnitude of the voltage applied to the memory cell MC, regardless of the direction of the current flow.

The switching element SEL may be, for example, a two-terminal switching element. When a voltage applied between two terminals is smaller than a threshold voltage, a corresponding switching element is in a "high-resistance" state, e.g., in an electrically non-conductive state. When a voltage applied between two terminals is equal to or greater than the threshold value, a corresponding switching element transitions to a "low-resistance" state, e.g., to an electrically conductive state. A switching element may have this function regardless of the polarity of voltage.

With a current supply controlled by a switching element SEL, a resistance value of a corresponding magnetoresistance effect element MTJ can be switched between a low-resistance state and a high-resistance state. The magnetoresistance effect element MTJ functions as a memory element that allows data to be written therein according to a change in its resistance state, stores the written data in a non-volatile manner, and allows the stored data to be read therefrom.

However, when a switching element SEL is short-circuited due to some kind of defect, it is no longer possible for the switching element SEL to control a current flowing through a corresponding magnetoresistance effect element MTJ, in accordance with a voltage being applied. In this case, a memory cell MC containing this short-circuited switching element SEL may have an unintentional current flow, which is not preferable. In the description below, a memory cell MC containing a short-circuited switching element SEL will be referred to as a "defective memory cell MC" or a "fail bit", and will be distinguished from memory cells MC functioning normally.

Figure 3:
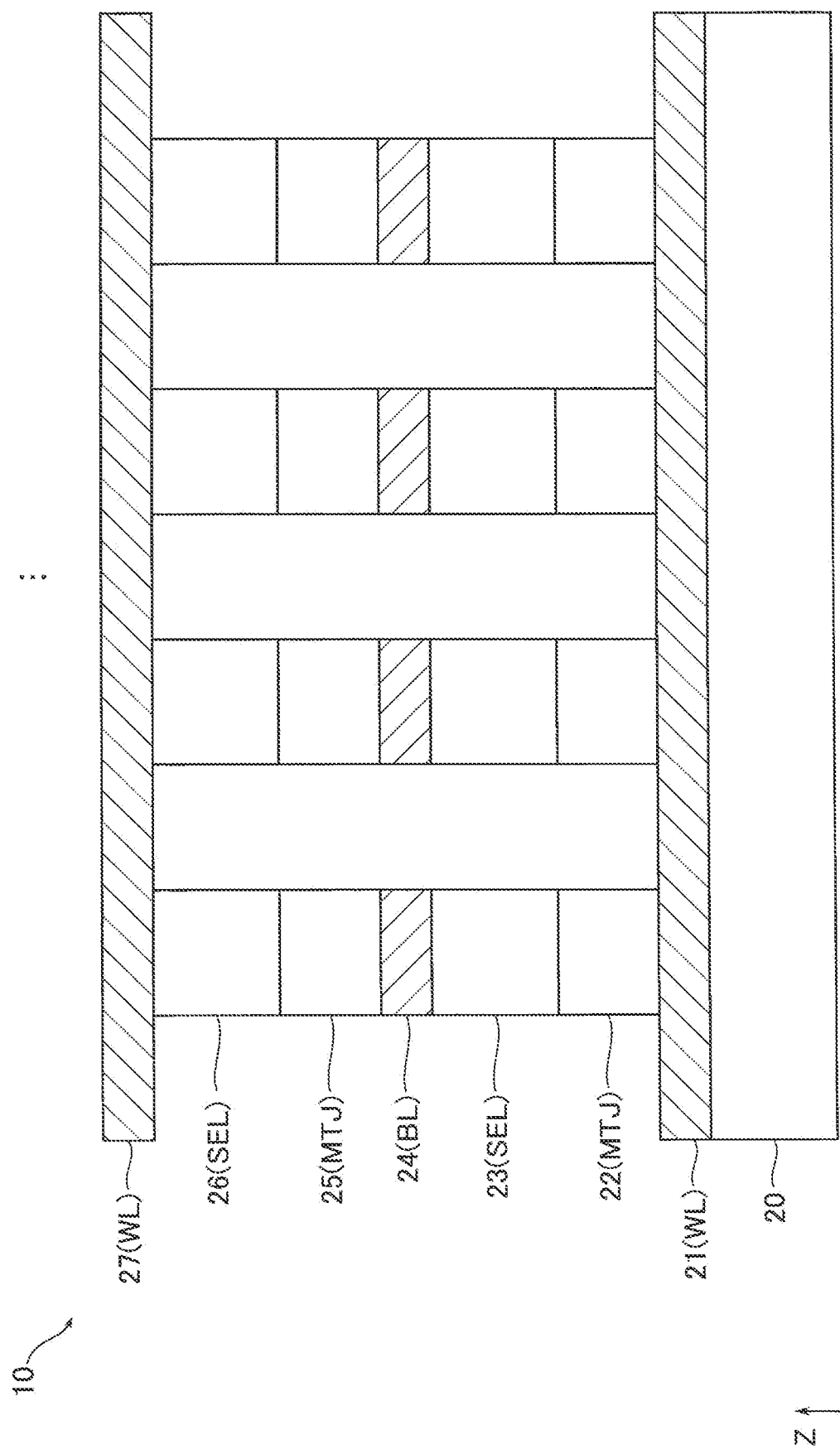
FIG. 3 is a cross-sectional view illustrating a configuration of the memory cell array of the magnetic memory device according to embodiment.
Figure 4:
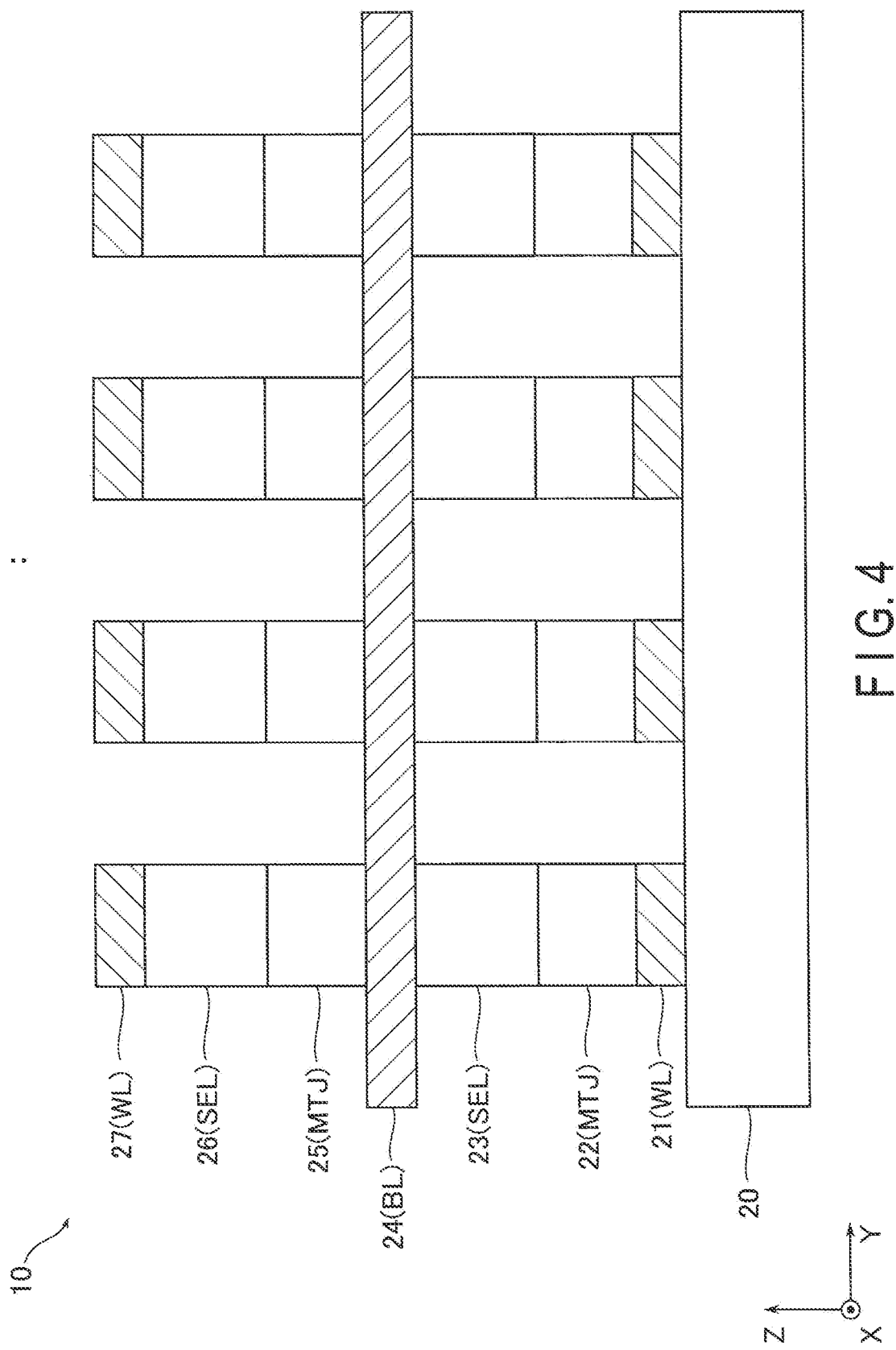
FIG. 4 is a cross-sectional view illustrating a configuration of the memory cell array of the magnetic memory device according to the embodiment.

Next, a cross-sectional configuration of the memory cell array 10 will be described with reference to FIGS. 3 and 4. FIGS. 3 and 4 are each an example of a cross-sectional view for illustrating a configuration of a memory cell array of the magnetic memory device according to the embodiment. In FIGS. 3 and 4, interlayer insulation films are omitted for convenience of description.

In the following description, a plane parallel to a surface of a semiconductor substrate 20 will be referred to as an "XY plane", and an axis perpendicular to the XY plane will be referred to as a "Z axis". The direction approaching the semiconductor substrate 20 along the Z axis is considered a "lower" side, and the direction moving away from the semiconductor substrate 20 along Z axis is considered an "upper" side. Within the XY plane, two axes perpendicular to each other form a pair, and one of these axes will be referred to as an "X axis" and the other will be referred to as a "Y axis".

As shown in FIGS. 3 and 4, the memory cell array 10 is provided on an upper side of the semiconductor substrate 20.

The semiconductor substrate 20 has the upper surface provided with, for example, a plurality of conductors 21. The respective conductors 21 have conductivity and function as the word lines WL. An insulator (not shown) is provided in each region between two adjacent conductors 21. With this, the conductors 21 are insulated from each other. FIGS. 3 and 4 illustrate a case where the plurality of conductors 21 are provided on the semiconductor substrate 20; however, the configuration is not limited to this. For example, the conductors 21 may be provided above the semiconductor substrate 20 without being in contact with the semiconductor substrate 20.

Each one of the conductors 21 has an upper surface provided with a plurality of elements 22 which respectively function as the magnetoresistance effect elements MTJ. The elements 22 provided on the upper surface of the conductor 21 are aligned along the X axis, for example. That is, the plurality of elements 22 aligned along the X axis are commonly coupled to the upper surface of one conductor 21. The configuration of the elements 22 will be described in detail later.

Each of the elements 22 has an upper surface provided with an element 23 which functions as a switching element SEL. Each of the elements 23 has an upper surface coupled to any one of the conductors 24.

The conductors 24 have conductivity and function as the bit lines L. The plurality of elements 23 aligned along the Y axis are commonly coupled to one conductor 24. FIGS. 3 and 4 illustrate a case where each of the elements 23 is provided on the corresponding element 22 and the corresponding conductor 24; however, the configuration is not limited to this. For example, each of the elements 23 may be coupled to a corresponding element 22 and a corresponding conductor 24 with a conductive contact plug (not shown) interposed therebetween.

With the configuration described above, in the memory cell array 10, a single memory cell MC is provided between a single word line WL and a single bit line BL.

1.1.3 Magnetoresistive Effect Element

Figure 5:
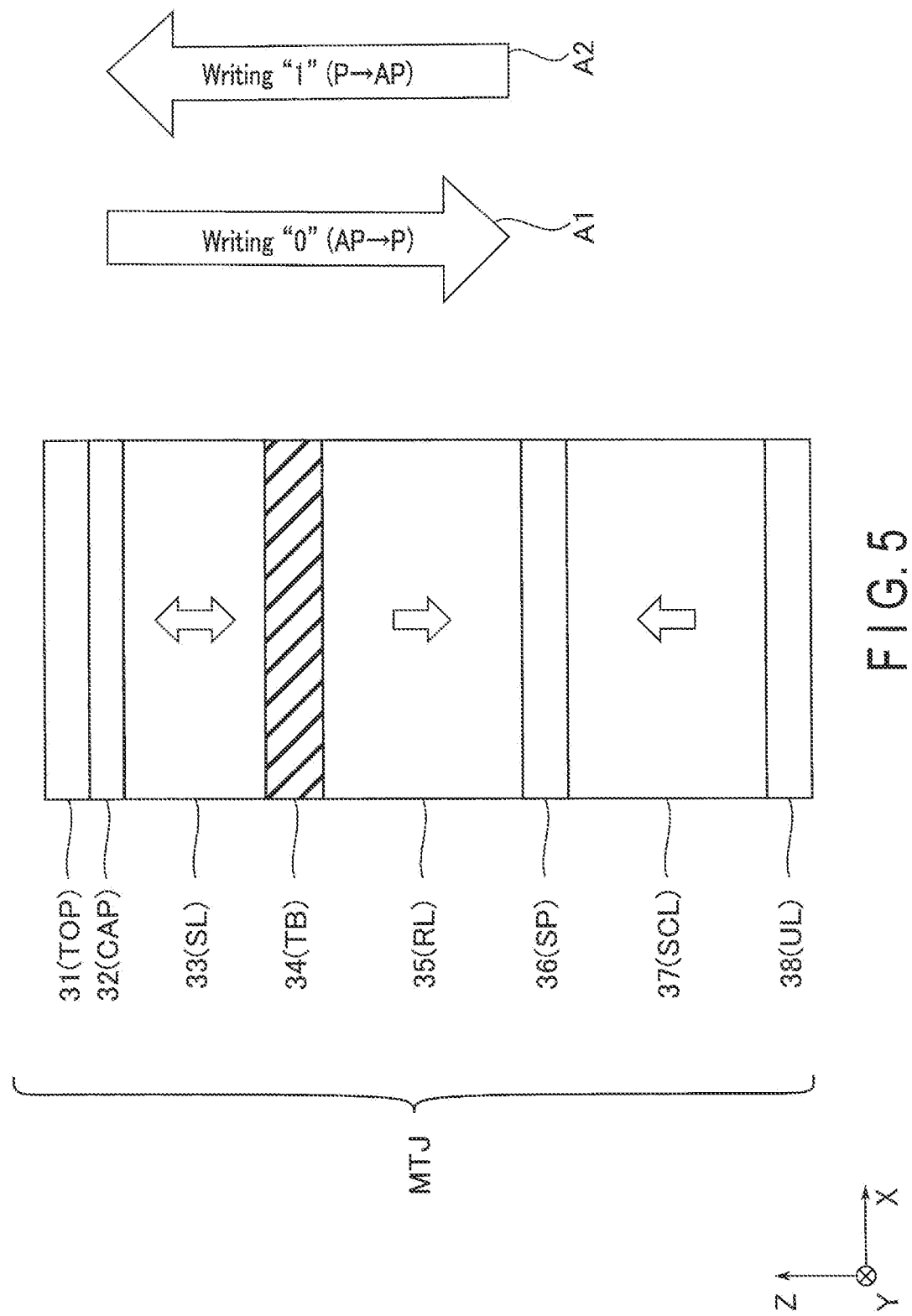
FIG. 5 is a cross-sectional view illustrating a configuration of a magnetoresistance effect element of the magnetic memory device according to the embodiment.

Next, a configuration of a magnetoresistance effect element of a magnetic device according to the embodiment will be described with reference to FIG. 5. FIG. 5 is a cross-sectional view showing a configuration of the magnetoresistance effect element of the magnetic memory device according to the embodiment. FIG. 5 shows an exemplary cross section of the magnetoresistance effect element MTJ shown in, for example, FIGS. 3 and 4, cut along a plane perpendicular to the Z axis (e.g., the XZ plane).

As shown in FIG. 5, the magnetoresistance effect element MTJ includes, for example, a non-magnet 31 which functions as a top layer TOP, a non-magnet 32 which functions as a capping layer CAP, a ferromagnet 33 which functions as a storage layer SL, a non-magnet 34 which functions as a tunnel barrier layer TB, a ferromagnet 35 which functions as a reference layer RL, a non-magnet 36 which functions as a spacer layer SP, a ferromagnet 37 which functions as a shift canceling layer SCL (shift cancelling layer), and a non-magnet 38 which functions as an under layer UL.

In the magnetoresistance effect element MTJ, the non-magnet 38, the ferromagnet 37, the non-magnet 36, the ferromagnet 35, the non-magnet 34, the ferromagnet 33, the non-magnet 32, and the non-magnet 31 are stacked in this order from the side of the word line WL toward the side of the bit line BL (in the Z axis direction). The magnetoresistance effect element MTJ functions as, for example a perpendicular-magnetization type MTJ element in which the magnetization direction of a magnet constituting the magnetoresistance effect element MTJ is perpendicular to the film surface. The magnetoresistance effect element MTJ may further include unillustrated layers between the layers 31 to 38.

The non-magnet 31 is a non-magnetic conductor, and functions as a top electrode that enhances electrical connectivity between the upper end of the magnetoresistance effect element MTJ and the bit line BL or the word line WL. The non-magnet 31 includes at least one element selected from the group consisting of, for example, tungsten (W), tantalum (Ta), tantalum nitride (TaN), titanium (Ti), and titanium nitride (TiN), or a compound including at least one of these elements.

The non-magnet 32 is non-magnet and has a function of preventing a damping coefficient of the ferromagnet 33 from increasing, and reducing a write current. The non-magnet 32 includes at least one nitride or oxide selected from the group consisting of, for example, magnesium oxide (MgO) magnesium nitride (MgN), zirconium nitride (ZrN), niobium nitride (NbN), silicon nitride (SiN), aluminum nitride (AlN), hafnium nitride (HfN), tantalum nitride (TaN), tungsten nitride (WN), chromium nitride (CrN), molybdenum nitride (MoN), titanium nitride (TiN), and vanadium nitride (VN). The non-magnet 32 may be a mixture of these nitrides and oxides. Specifically the non-magnet 32 is not limited to a binary compound consisting of two different elements, and may be a ternary compound consisting of three different elements, such as titanium aluminum nitride (AlTiN), etc.

The ferromagnet 33 has ferromagnetic properties, and has an easy axis of magnetization in a direction perpendicular to a film plane. The ferromagnet 33 has a magnetization direction toward either the bit line BL side or the word line WL side along the Z axis. The ferromagnet 33 contains at least one of iron (Fe), cobalt (Co), and nickel (Ni), and the ferromagnet 33 may further contain boron (B). More specifically, the ferromagnet 33 may contain, for example, iron cobalt boron (FeCoB) or iron boron (FeB), and have a body-centered crystal structure.

The non-magnet 34 is a non-magnetic insulator containing, for example, magnesium oxide (MgO), and may further contain boron (B), as described above. The non-magnet 34 has an NaCl crystal structure with its film plane oriented in a (001) plane, and functions as a seed material to be a nucleus for growth of a crystalline film from an interface with the ferromagnet 33 during a crystallization process of the ferromagnet 33. The non-magnet 34 is provided between the ferromagnet 33 and the ferromagnet 35, and forms, together with these two ferromagnets, a magnetic tunnel junction.

The ferromagnet 35 has ferromagnetic properties, and has an easy axis of magnetization in a direction perpendicular to the film plane. The ferromagnet 35 has a magnetization direction toward either the bit line BL side or the word line WL side along the Z axis. The ferromagnet 35 contains, for example, at least one of iron (Fe), cobalt (Co), and nickel (Ni). The ferromagnet 35 may further contain boron (B). More specifically, the ferromagnet 35 may contain, for example, iron cobalt boron (FeCoB) or iron boron (FeB), and have a body-centered crystal structure. The magnetization direction of the ferromagnet 35 is fixed, and is toward the direction of the ferromagnet 37 in the example of FIG. 5. The "magnetization direction" being "fixed" means that the magnetization direction is not varied by a current (spin torque) of a magnitude that could invert the magnetization direction of the ferromagnet 33.

The ferromagnet 35 may be a layer stack including a plurality of layers, although this is not illustrated in FIG. 5. Specifically, a layer stack that constitutes the ferromagnet 35 may have, for example, a structure including a layer containing the aforementioned iron cobalt boron (FeCoB) or iron boron (FeB) as an interface layer with the non-magnet 34, and including an additional ferromagnet stacked between the interface layer and the non-magnet 36 with a non-magnetic conductor interposed therebetween. The non-magnetic conductor in the layer stack that constitutes the ferromagnet 35 may contain at least one metal selected from the group consisting of, for example, tantalum (Ta), hafnium (Hf), tungsten (W), zirconium (Zr), molybdenum (Mo), niobium (Nb), and titanium (Ti). The additional ferromagnet in the layer stack that constitutes the ferromagnet 35 may contain at least one multilayer film selected from the group consisting of, for example, a multilayer film of cobalt (Co) and platinum (Pt) (Co/Pt multilayer film), a multilayer film of cobalt (Co) and nickel (Ni) (Co/Ni multilayer film), and a multilayer film of cobalt (Co) and palladium (Pd) (Co/Pa multilayer film).

The non-magnet 36 is a non-magnetic conductor, and contains at least one element selected from the group consisting of, for example, ruthenium (Ru), osmium (Os), iridium (Ir), vanadium (V), and chromium (Cr).

The ferromagnet 37 has ferromagnetic properties, and has an easy axis of magnetization in a direction perpendicular to the film plane. The ferromagnet 37 has a magnetization directed toward either the bit lines BL or the word lines WL along the Z axis. The magnetization direction of the ferromagnet 37 is fixed, similarly to the ferromagnet 35, and is toward the direction of the ferromagnet 35 in the example of FIG. 5. The ferromagnet 37 contains at least one alloy selected from the group consisting of, for example, cobalt platinum (CoPt), cobalt nickel (CoNi), and cobalt palladium (CoPd). The ferromagnet 37 may be a layer stack including a plurality of layers, similarly to the ferromagnet 35. In this case, the ferromagnet 37 may contain at least one multilayer film selected from the group consisting of, for example, a multilayer film of cobalt (Co) and platinum (Pt) (Co/Pt multilayer film), a multilayer film of cobalt (Co) and nickel (Ni) (Co/Ni multilayer film), and a multilayer film of cobalt (Co) and palladium (Pd) (Co/Pd multilayer film).

The ferromagnets 35 and 37 are antiferromagnetically coupled by the non-magnet 36. That is, the ferromagnets 35 and 37 are coupled in such a manner that their magnetization directions are anti-parallel to each other. Accordingly, the magnetization directions of the ferromagnets 35 and 37 are opposite to each other in the example of FIG. 5. Such a coupling structure of the ferromagnet 35, the non-magnet 36, and the ferromagnet 37 is referred to as a synthetic anti-ferromagnetic (SAF) structure. This allows the ferromagnet 37 to cancel the influence of a leakage field of the ferromagnet 35 on the magnetization direction of the ferromagnet 33. This prevents an asymmetry from occurring in the ease of reversal of the magnetization direction of the ferromagnet 33, due to, e.g., a leakage field of the ferromagnet 35 (that is, prevents the ease of reversal of the magnetization direction of the ferromagnet 33 from differing between the case of reversing from one side to the other and the case of reversing in the opposite direction).

The non-magnet 38 is a non-magnetic conductor, and has a function as an electrode for improving electrical connectivity between the bit line BL and the word line WL. The non-magnet 38 contains, for example, a high-melting-point metal. The high-melting-point metal is a material having a melting point higher than that of iron (Fe) and cobalt (Co), and includes at least one element selected from, for example, zirconium (Zr), hafnium (Hf), tungsten (W), chromium (Cr), molybdenum (Mo), niobium (Nb) titanium (Ti), tantalum (Ta), vanadium (V), ruthenium (Ru), and platinum (Pt).

The embodiment adopts a spin injection write technique, in which a write current is allowed to directly flow through the magnetoresistance effect element MTJ, and a spin torque is injected into the storage layer SL and the reference layer RL by the write current, thereby controlling the magnetization directions of the storage layer SL and the reference layer RL. The magnetoresistance effect element MTJ may take either a low-resistance state or a high resistance state, depending on whether the relative relationship between the magnetization directions of the storage layer SL and the reference layer RL is parallel or anti-parallel.

When write current Ic0 of a certain magnitude is allowed to flow through the magnetoresistance effect element MTJ in the direction of the arrow A1 in FIG. 5, namely, the direction from the storage layer SL toward the reference layer RL, the relative relationship between the magnetization directions of the storage layer SL and the reference layer RL becomes parallel. In this parallel state, resistance of the magnetoresistance effect element MTJ takes the minimum value, and the magnetoresistance effect element MTJ is set to a low-resistance state. This low-resistance state is called a "P (parallel) state", and is defined as a state of data "0".

When write current Ic1 greater than the write current Ic0 is allowed to flow through the magnetoresistance effect element MTJ in the direction of the arrow A2 in FIG. 5, namely, the direction from the reference layer RL toward the storage layer SL (opposite to the arrow A1), the relative relationship between the magnetization directions of the storage layer SL and the reference layer RL becomes anti-parallel. In this anti-parallel state, resistance of the magnetoresistance effect element MTJ takes the maximum value, and the magnetoresistance effect element MTJ is set to a high-resistance state. This high-resistance state is called an "anti-parallel (AP) state", and is defined as, for example, the stare of data "1".

The following description will be given pursuant to the above-described data-defining method; however, how data "1" and data "0" are defined is not limited to the above-described example. For example, the P state may be defined as data "1", and the AP state may be defined as data "0".

1.1.4 Defective Memory Cell Table

Next, a defective memory cell table stored in the memory system including the magnetic memory device according to the embodiment will be described with reference to a conceptual diagram shown in FIG. 6.

As shown in FIG. 6, the defective memory cell table 5 stores address information on a defective memory cell MC and address information on a word line WL and a bit line BL both coupled to the defective memory cell MC in such a manner that the address information on the defective memory cell MC and the address information on the word line WL and the bit line BL are correlated with each other.

Specifically, in the example shown in FIG. 6, address information <3,5,7> on a memory cell MC<3,5,7> and address information <6,8,9> on a memory cell MC<6,8,9> are stored as address information on a defective memory cell MC.

With the memory cell MC<3,5,7> being coupled between a word line WL<4,5> and a bit line BL<3,7>, address information <4,5> on the word line WL<4,5> and address information <3,7> on the bit line BL<3,7> are each stored. With the memory cell MC<6,8,9> being coupled between a word line WL<6,8> and a bit line BL<7,9>, address information <6,8> on the word line WL<6,8> and address information <7,9> on the bit line BL<7,9> are each stored as address information on a word line WL and a bit line BL both coupled to a defective memory cell MC.

There is a one-to-one correspondence between address information on a defective memory cell MC and address information on a pair of a word line WL and a bit line BL coupled to the defective memory cell MC. Therefore, the defective memory cell table 5 may be only required to store at least one of address information on a defective memory cell MC and address information on a pair of a word line WL and a bit line BL.

In the case described above, the defective memory cell table 5 is stored in the memory controller 3. However, this is not a limitation. For example, the defective memory cell table 5 may be stored in a nonvolatile manner in the memory cell array 10 within the magnetic memory device 2.

1.2 Operations

Next, the operations of the magnetic memory device according to the embodiment will be described.

1.2.1 Series of Operations until Defective Memory Cell Is Increased in Resistance A series of operations that are taken until a defective memory cell MC within the magnetic memory device 2 is increased in resistance will be described with reference to a flowchart shown in FIG. 7.

Figure 7:
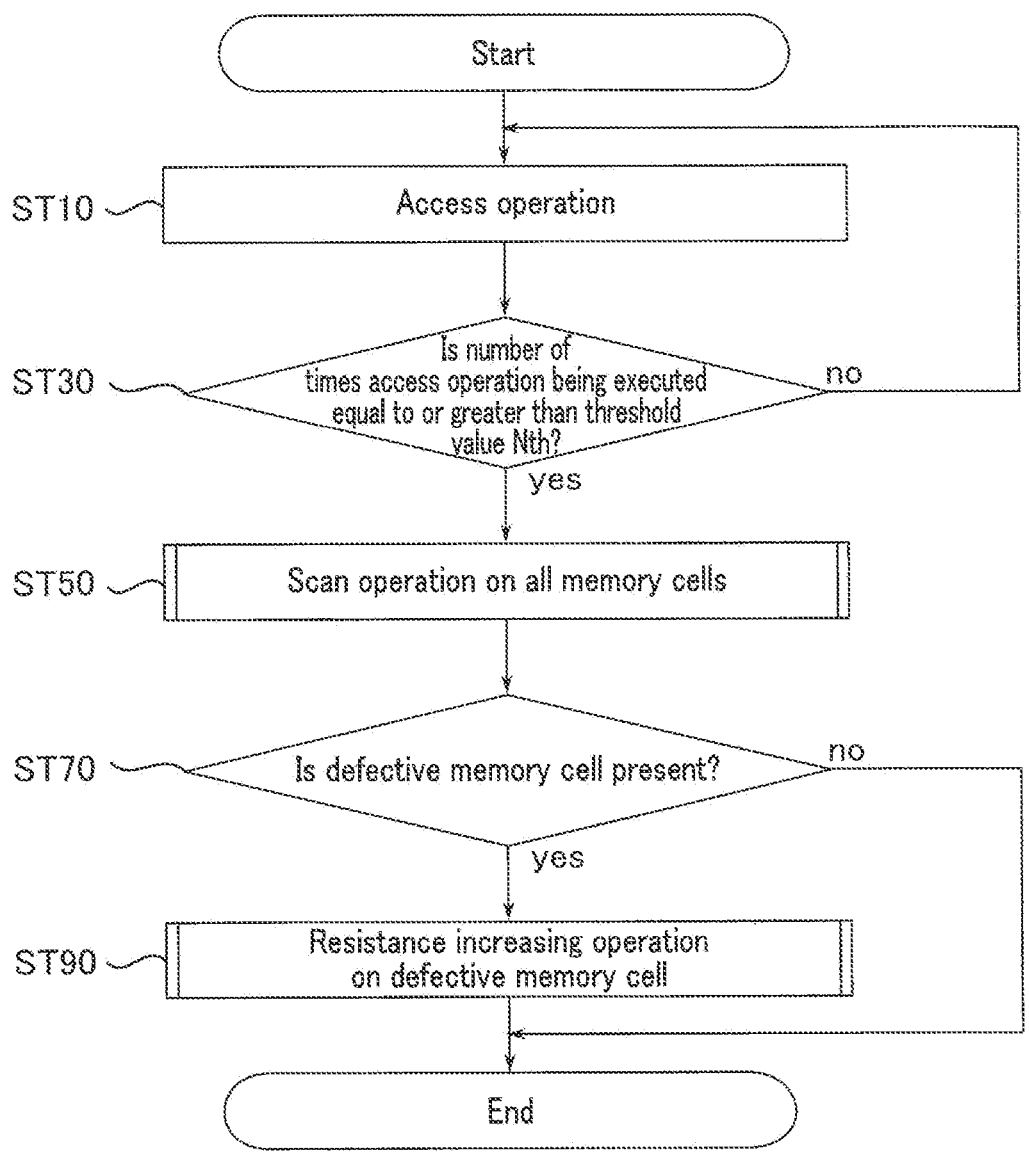
FIG. 7 is a flowchart illustrating a series of operations in the magnetic memory device according to the embodiment.

As shown in FIG. 7, in step ST10, the memory controller 3 issues a command (access command) for execution of a write operation or a read operation, and sends it to the magnetic memory device 2. Upon receipt of the access command from the memory controller 3, the magnetic memory device 2 executes the write operation or the read operation. As described in the above, in the write operation, the control circuit 18 executes a constant-current control in such a manner that a predetermined write current Ic0 or Ic1 flows through a memory cell MC which is a write target. Similarly, in the read operation, the control circuit 18 executes the constant current control in such a manner that a predetermined write current flows through a memory cell MC which is a read target.

The memory controller 3 counts, for example, the number of times the write operation and the read operation are executed, and stores the count value. The memory controller 3 may count the count value of only the write operation or only the read operation.

In step ST30, the memory controller 3 determines whether or not the number of times the write operation and the read operation are executed is equal to or greater than a threshold value Nth. For example, the memory controller 3 compares the count value of the number of times the write operation and the read operation are executed with the predetermined threshold value Nth (for example, 10,000 times). When the number of times the write operation and the read operation are executed is equal to or greater than the threshold value Nth (step ST30; Yes), the processing proceeds to step ST50. When the number of times the write operation and the read operation are executed is smaller than the threshold value Nth (step ST30; No), the processing returns to step ST10. That is, the memory system 1 may operate without executing the processing subsequent to step ST50 until the number of times the write operation and the read operation are executed becomes the threshold value Nth or greater. A plurality of threshold values Nth may be set, and the processing subsequent to step ST50 may be performed once every time the number of times the write operation and the read operation are executed exceeds one of the threshold values Nth that are different from each other.

In step ST50, the memory controller 3 issues a command (scan command) for execution of a scan operation, and transmits it to the magnetic memory device 2. Upon receipt of the scan command, the magnetic memory device 2 executes the scan operation with respect to all of the memory cells MC within the memory cell array 10.

In the scan operation, the control circuit 18 executes constant voltage control in such a manner that a predetermined voltage is applied to a memory cell MC which is a scan target. As a result of the scan operation, the magnetic memory device 2 specifies address information on a defective memory cell MC, and notifies the memory controller 3. This enables the memory controller 3 to store, in the defective memory cell table 5, the address on the defective memory MC within the memory cell array 10. Details of the scanned operation will be described later.

In step ST70, the memory controller 3 determines based on information stored in the defective memory cell table 5 whether or not the defective memory cell MC is present in the magnetic memory device 2. When information on the defective memory cell MC is stored in the defective memory cell table 5 (step ST70; Yes), the processing proceeds to step ST90. When information on the defective memory cell MC is not stored in the defective memory cell table 5 (step ST70; No), the processing omits step ST90.

In step ST90, the memory controller 3 issues a command for execution of a resistance increasing operation (resistance increasing command), and transmits it to the magnetic memory device 2. Upon receipt of the resistance increasing command from the memory controller 3, the magnetic memory device 2 executes the resistance increasing operation. The resistance increasing command contains, e.g., address information on the defective memory cell MC which is a target for resistance increase.

In the resistance increasing operation, the control circuit 18 executes constant voltage control in such a manner that a predetermined voltage is applied to the defective memory cell MC which is a target for resistance increase. This enables the magnetic memory device 2 to increase a resistance of a switching element SEL within the defective memory cell MC. The resistance increasing operation will be described later in detail.

This is the end of the series of operations that are taken until the defective memory cell MC within the magnetic memory device 2 is increased in resistance.

1.2.2 Scan Operation

Next, a scan operation will be described in detail.

Figure 8:
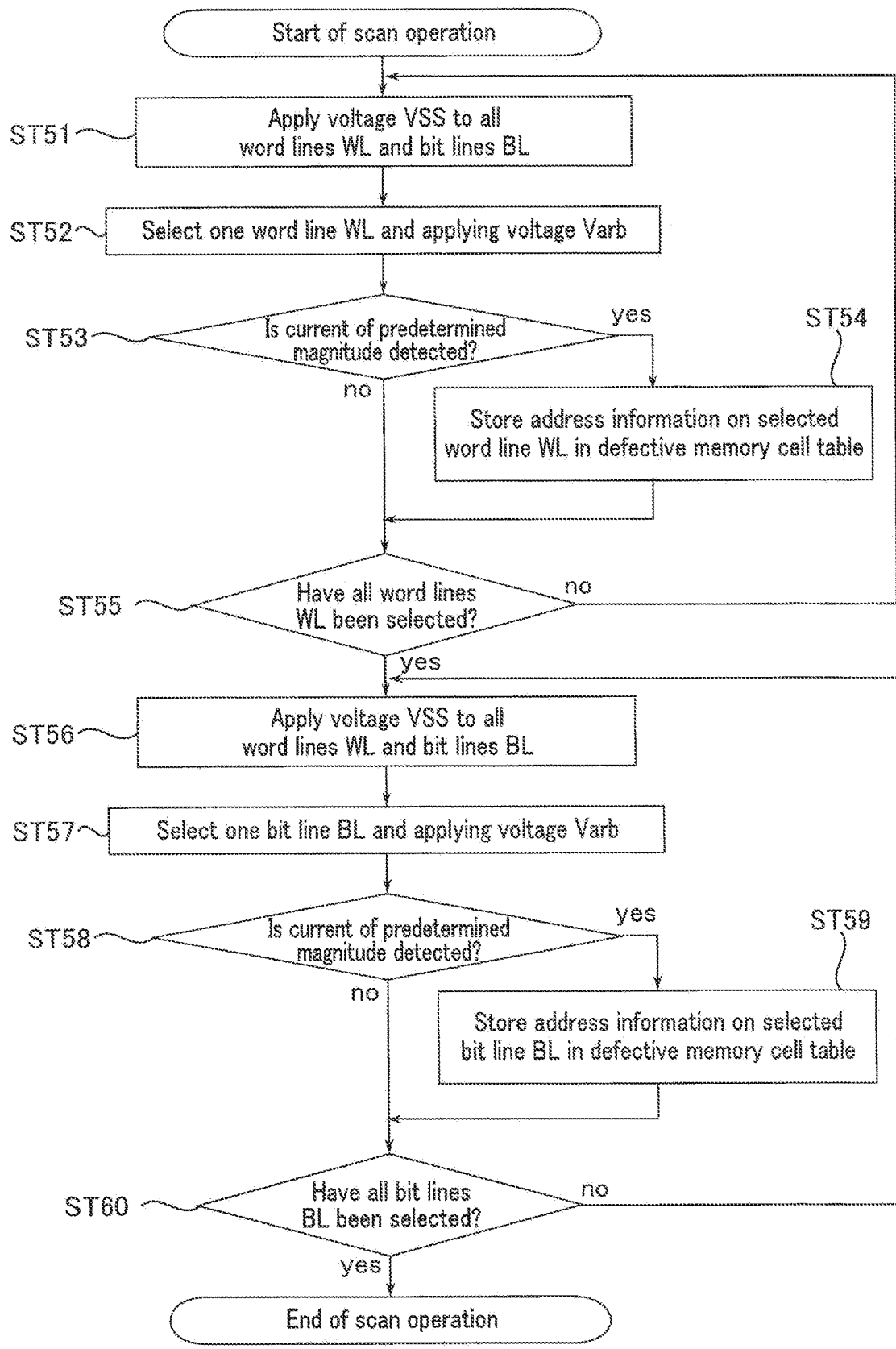
FIG. 8 is a flowchart illustrating a scan operation in the magnetic memory device according to the embodiment.

FIG. 8 is a flowchart illustrating the scan operation in the magnetic memory device according to the embodiment, and corresponds to step ST50 in FIG. 7. FIG. 8 shows an operation in the magnetic memory device 2 based on the scan command, and an accompanying operation of the memory controller 3.

As shown in FIG. 8, in step ST51, the row selection circuit 11 and the column selection circuit 12 apply a voltage VSS to all of the word lines WL and the bit lines BL. The voltage VSS is a ground voltage and represents, for example, 0 V. The following description will assume that the voltage VSS is equal to 0 V.

In step ST52, the row selection circuit 11 selects one of the word lines WL and applies a voltage Varb to this selected word line WL. The voltage Varb is greater than the voltage VSS and smaller than a threshold voltage Vth of the switching element SEL.

In step ST53, the control circuit 18 determines whether or not a current of a predetermined magnitude has flowed through a selected word line WL in a state set in steps ST51 and ST52. When a current of a predetermined magnitude is detected (step ST53; Yes), the processing proceeds to step ST54. When a current of a predetermined magnitude is not detected (step ST53; No), the processing proceeds to step ST55.

In step ST54, the control circuit 18 outputs to the memory controller 3 address information on a word line WL selected in step ST52. The memory controller stores this address information in the defective memory cell table 5.

In step ST55, the control circuit 18 determines whether or not all of the word lines WL have been selected. When not all of the word lines WL have been selected (step ST55; No), the processing returns to step ST51. In this manner, steps ST51 to ST54 are repeated until all of the word lines WL are selected. When all of the word lines WL have been selected (step ST55; Yes), the processing proceeds to step ST56.

In step ST56, the row selection circuit 11 and the column selection circuit 12 apply the voltage VSS to all of the word lines WL and the bit lines BL.

In step ST57, the column selection circuit 12 selects one of the word lines BL, and applies the voltage Varb to this selected bit line BL.

In step ST58, the control circuit 13 determines whether or not a current of a predetermined magnitude has flowed through a selected bit line BL in a state set in steps ST56 and ST57. When a current of a predetermined magnitude is detected (step ST58; Yes), the processing proceeds to step ST59. When a current of a predetermined magnitude is not detected (step ST58; No) the processing proceeds to step ST60.

In step ST59, the control circuit 18 outputs to the memory controller 3 address information on a bit line BL selected in step ST57. The memory controller 3 stores this address information in the defective memory cell table 5. At this time, the memory controller 3 correlates address information on a bit line BL with address information on any of the word lines WL already stored in the defective memory cell table 5. In this way, address information on a defective memory cell can be specified.

In step ST60, the control circuit 18 determines whether or not all of the bit lines BL have been selected. When not all of the bit lines BL have been selected (step ST60; No), the processing returns to step ST56. In this manner, steps ST56 to ST59 are repeated until all of the bit lines BL are selected. When all of the bit lines BL have been selected (step ST60; Yes), the scan operation is terminated.

Figure 9:
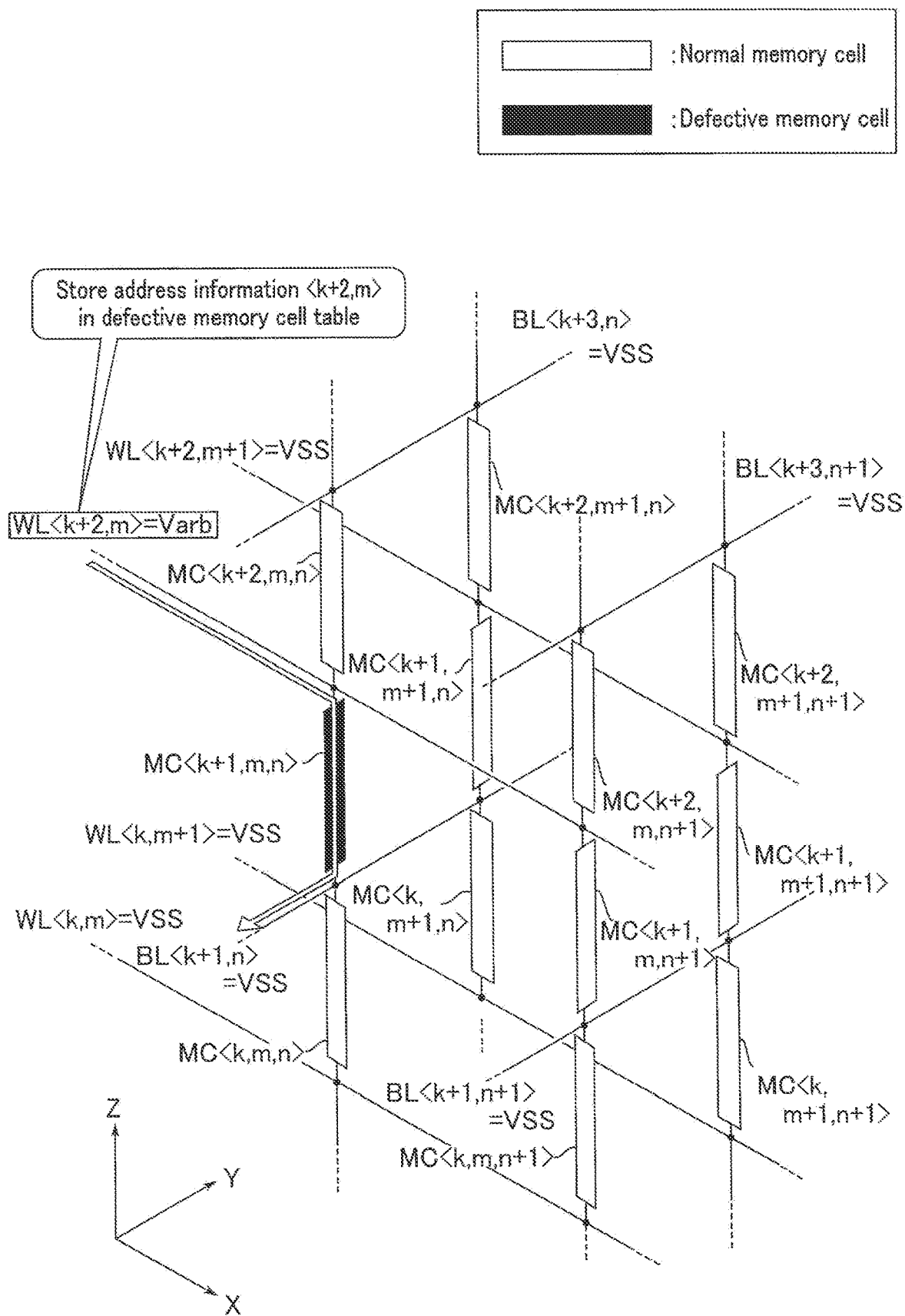
FIG. 9 is a schematic diagram illustrating the scan operation in the magnetic memory device according to the embodiment.
Figure 10:
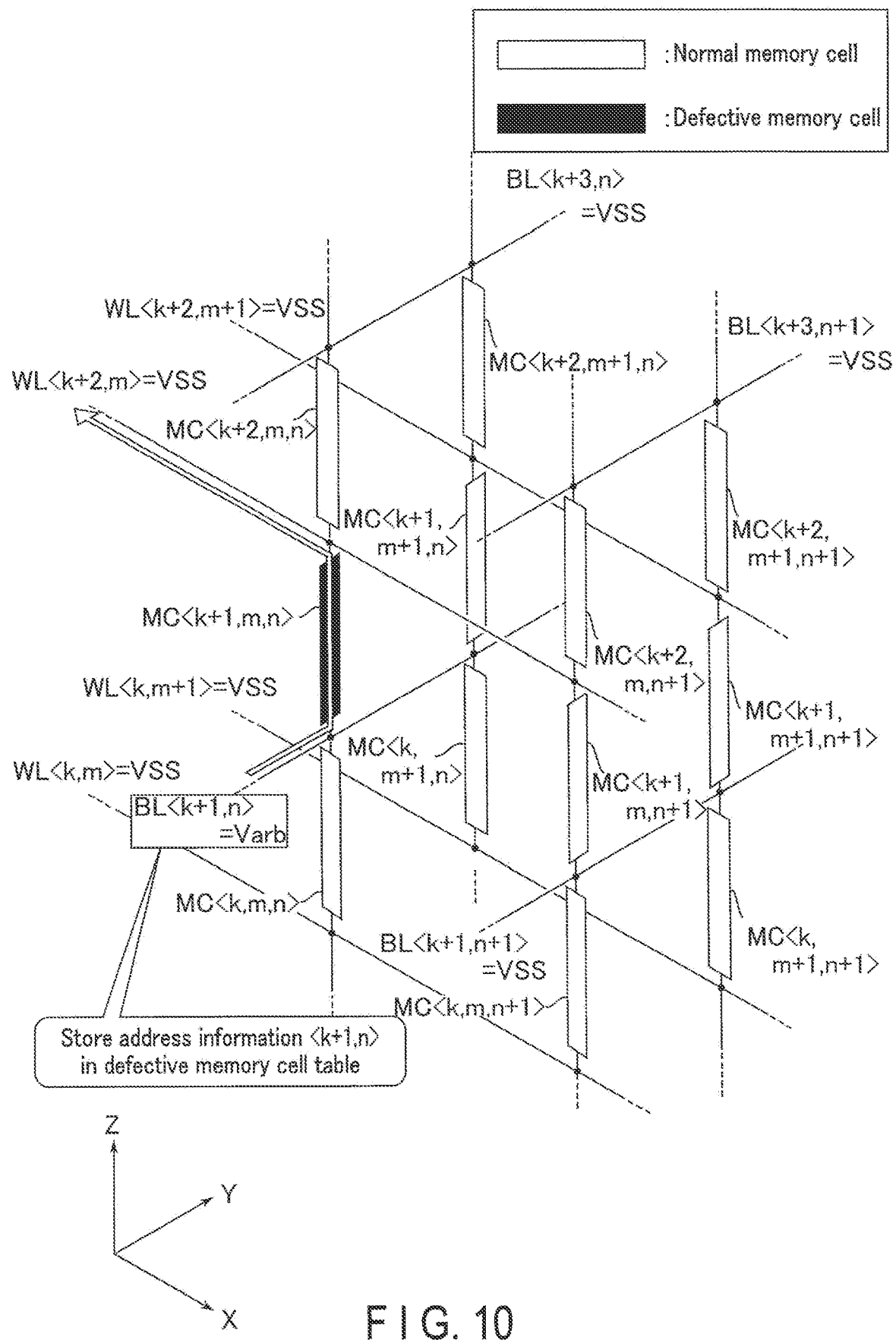
FIG. 10 is a schematic diagram illustrating the scan operation in the magnetic memory device according to the embodiment.

FIGS. 9 and 10 are each a schematic diagram illustrating a scan operation in the magnetic memory device according to the embodiment, and respectively correspond to steps ST51 to ST54 and steps ST56 to ST59 in FIG. 8.

FIGS. 9 and 10 each show four word lines WL, four bit lines BL, and twelve memory cells MC each coupled between one of the word lines WL and one of the bit lines BL. The four word lines WL are WL<k,m>, WL<k,m+1>, WL<k+2,m>, and WL<k+2,m+1>. The four bit lines BL are BL<k+1,n>, BL<k+1,n+1>, BL<k+3,n>, and BL<k+3,n+1>. FIGS. 9 and 10 each show a scan operation in a case where a memory cell MC<k+1,m,n> of the twelve memory cells MC corresponds to a defective memory cell MC.

First, an operation when a word line WL is selected will be described with reference to FIG. 9.

As shown in FIG. 9, if a word line WL<k+2,m> is selected, the voltage Varb is applied to a plurality of memory cells MC (for example, a defective memory cell MC<k+1,m,n> and normal memory cells MC<k+1,m,n+1>, MC<k+2,m,n>, and MC<k+2,m,n+1>) coupled to the word line WL<k+2,m>.

The respective switching elements SEL within the normal memory cells MC<k+1,m,n+1>, MC<k+2,m,n>, and MC<k+2,m, n+1> remain in an OFF state even in receipt of application of the voltage Varb that is smaller than the threshold voltage Vth. Therefore, a current does not flow through the normal memory cells MC<k+1,m,n+1>, MC<k+2,m,n>, and MC<k+2,m, n+1>.

On the other hand, the switching element SEL within the defective memory cell MC<k+1,m,n> is short-circuited and thus behaves, upon receipt of application of the voltage Varb that is smaller than the threshold voltage Vth, in the same manner as the switching element SEL in the ON state. This causes a current to flow by way of the defective memory cell MC<k+1,m,n>.

As described above, when the voltage Varb is applied to the word line WL<k+2,m> and a current flows therethrough, it is understood that at least one of the memory cells MC coupled to this word line WL<k+2,m> is a defective memory cell MC. Therefore, the control circuit 18 outputs address information <k+2,m> on the word line WL<k+2,m> to the memory controller 3, thereby storing it in the defective memory cell table 5.

Next, an operation when a bit line BL is selected will be described with reference to FIG. 10.

As shown in FIG. 10, when a word line BL<k+1;n> is selected, the voltage Varb is applied to a plurality of memory cells (for example, a defective memory cell MC<k+1,m,n> and normal memory cells MC<k+1,m+1,n>, MC<k,m,n>, and MC<k,m+1,n>) coupled to the word line BL<k+1,n>.

The respective switching elements SEL within the normal memory cells MC<k+1,m+1,n>, MC<k,m,n>, and MC<k, m+1,n> remain in an OFF state even in receipt of application of the voltage Varb that is smaller than the threshold voltage Vth. Therefore, a current does not flow through the normal memory cells MC<k+1,m+1,n>, MC<k,m,n>, and MC<k, m+1,n>.

On the other hand, the switching element SEL<k+1,m,n> within the defective memory cell MC<k+1,m,n> is short-circuited, and therefore, upon receipt of application of the voltage Varb that is smaller than the threshold voltage Vth, behaves in the same manner as the switching element SEL<k+1,m,n> in the ON state. This causes a current to flow by way of the defective memory cell MC<k+1,m,n>.

As described above, if the voltage Varb is applied to the bit line BL<k+1,n> and a current flows therethrough, it is understood that at least one of the memory cells MC coupled to this bit line BL<k+1,n> is a defective memory cell MC. Therefore, the control circuit 18 outputs address information <k+1,n> on the bit line BL<k+1,n> to the memory controller 3, thereby storing it in the defective memory cell table 5.

This enables the memory controller 3 to determine that the memory cell MC<k+1,m,n> coupled between address information <k+2,m> on a word line WL and address information <k+1,n> on a bit line BL both stored in the defective memory cell table 5 is a defective memory cell MC, and to store the address information in such a manner that the address information on the defective memory cell MC and the address information <k+2,m> and <k+1,n> are correlated with each other.

1.2.3 Resistance Increasing Operation

Next, the resistance increasing operation on a defective memory cell MC will be described.

Figure 11:
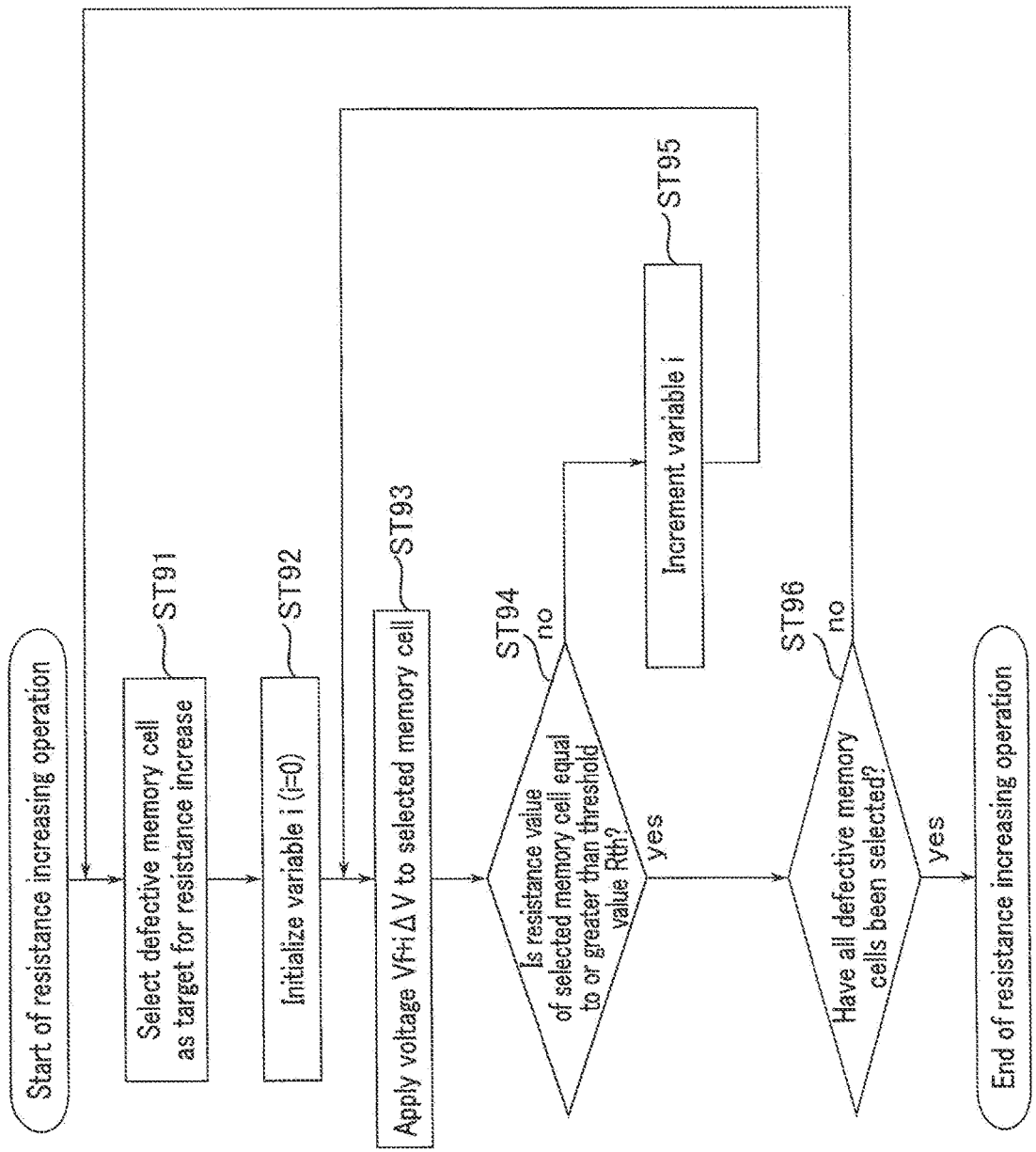
FIG. 11 is a flowchart illustrating a resistance increasing operation in the magnetic memory device according to the embodiment.

FIG. 11 is a flowchart illustrating the resistance increasing operation on a defective memory cell in the magnetic memory device according to the embodiment, and corresponds to step ST90 in FIG. 7. FIG. 11 shows the operation in the magnetic memory device 2 based on the resistance increasing command from the memory controller 3.

First, the memory controller 3 issues a resistance increasing command including address information on the defective memory cell MC which is a target for resistance increase, and sends it to the magnetic memory device 2.

As shown in FIG. 11, in step ST91, upon receipt of the resistance increasing command, the control circuit 18 selects the defective memory cell MC as a target for resistance increase based on the address information on a defective memory cell MC included in the received resistance increasing command. Hereinafter, for the sake of explanation, the selected defective memory cell MC will be referred to as a "selected memory cell MC".

In step ST92, the control circuit 18 initializes a variable i to "0" (i=0).

In step ST93, the row selection circuit 11 and the column selection circuit 12 apply a voltage (Vf+i$\Delta$V) to a selected memory cell MC. For example, the row selection circuit 11 and the column selection circuit 12 apply the voltage (Vf+ i$\Delta$V) to a selected word line WL, and apply the voltage VSS to a selected bit line BL. Voltages Vf and $\Delta$V may be set at given numbers, for example, in such a manner that the voltage (Vf+i$\Delta$V) that is applied to the selected memory cell MC is sufficiently smaller than a threshold voltage Vth of the switching element SEL and a voltage (a write voltage and a read voltage) that is applied to the selected memory cell MC at the time of the access operation. This makes it possible to prevent an erroneous write from occurring due to a voltage that is applied to the memory cell MC at the time of the resistance increasing operation.

At the time of applying a voltage to the selected memory cell MC, which one of the selected word line WL and the selected bit line BL is to be at high voltage is freely selectable. That is, the row selection circuit 11 and the column selection circuit 12 may apply the voltage (Vf+i$\Delta$V) to the selected word line BL and the voltage VSS to the selected word line WL.

In step ST94, the control circuit 18 calculates a resistance value based on a current that flows in the selected memory cell MC in step ST93, and determines whether or not the resistance value is equal to or greater than a threshold value Rth. The threshold value Rth is sufficiently greater (for example, more than three orders of magnitude higher) than the resistance value of the memory cell MC in a state in which, for example, the switching element SEL is short-circuited. That is, the threshold value Rth is set to such a value that the switching element SEL is considered to be disconnected. When the resistance value of the selected memory cell MC is equal to or greater than the threshold value Rth (step ST94; Yes), the processing proceeds to step ST96. When the resistance value of the selected memory cell MC is smaller than the threshold value Rth (step ST94; No), the processing proceeds to step ST95.

In step ST95, the control circuit 18 increments the variable i and returns to the processing in step ST33. In this manner, a voltage that is stepped up by $\Delta$V is applied to the selected memory cell until it is determined that the resistance value of the selected memory cell MC becomes the threshold value Rth or greater.

In step ST96, the control circuit 18 determines whether or not all of the defective memory cells MC have been selected. For example, the control circuit 18 determines whether or not all of the addresses of the defective memory cells MC included in the resistance increasing command received from the memory controller 3 have been accessed. When it is determined that there is a non-selected defective memory cell MC (step ST96; No), the processing returns to step ST91. In this manner, steps ST91 to ST96 are repeated until the resistance values of all defective memory cells MC exceed the threshold value Rth. On the other hand, when it is determined that all of the defective memory cells MC have been selected (step ST96; Yes), the processing is terminated.

This is the end of the resistance increasing operation.

FIG. 12 is a timing chart illustrating the resistance increasing operation in the magnetic memory device according to the embodiment. FIG. 12 shows, in chronological order, a relationship between a voltage that is applied the selected memory cell MC in step ST93 (and step ST94) in FIG. 11 and a resistance value of the defective memory cell MC that is selected at that time. FIG. 12 shows a case where the selected memory cell MC is increased in resistance by the (j+1)th application of a voltage (j is a natural number).

As shown in FIG. 12, at time t0, the variable i is set to "0", and a voltage Vf is applied to the selected memory cell MC. At this time, the switching element SEL of the selected defective memory cell MC is short-circuited. Accordingly, a large amount of current flows through the selected memory cell MC, and a resistance value of the selected memory cell MC takes a much smaller value than the threshold value Rth.

Similarly, the variable i is set to "1" and a voltage (Vf+ΔV) is applied to the selected memory cell MC at time t1, and the variable i is set to "2" and a voltage (Vf+2ΔV) is applied to the selected memory cell MC at time t2. In the example shown in FIG. 12, a resistance value of the selected memory cell MC increases very little. That is, the switching element SEL of the selected defective memory cell MC remains short-circuited.

At time tj, the variable i is set to j, and a voltage (Vf+jΔV) is applied to the selected memory cell MC. By this, the switching element SEL of the selected defective memory cell MC fuses in its short-circuited portion, and sharply increases in resistance to such a value that the switching element SEL is disconnected or deemed to be disconnected. Therefore, a current flows very little through the selected memory cell MC (about 1/1000 of a current flowing through the selected memory cell MC from the time t0 to the time t2), so that the resistance value of the selected memory cell MC exceeds the threshold value Rth.

At time tj, the control circuit 18 confirms that the switching element SEL within the selected defective memory cell MC has been increased in resistance, and applies the voltage VSS to the selected memory cell MC. This is the end of the resistance increasing operation.

Figure 13:
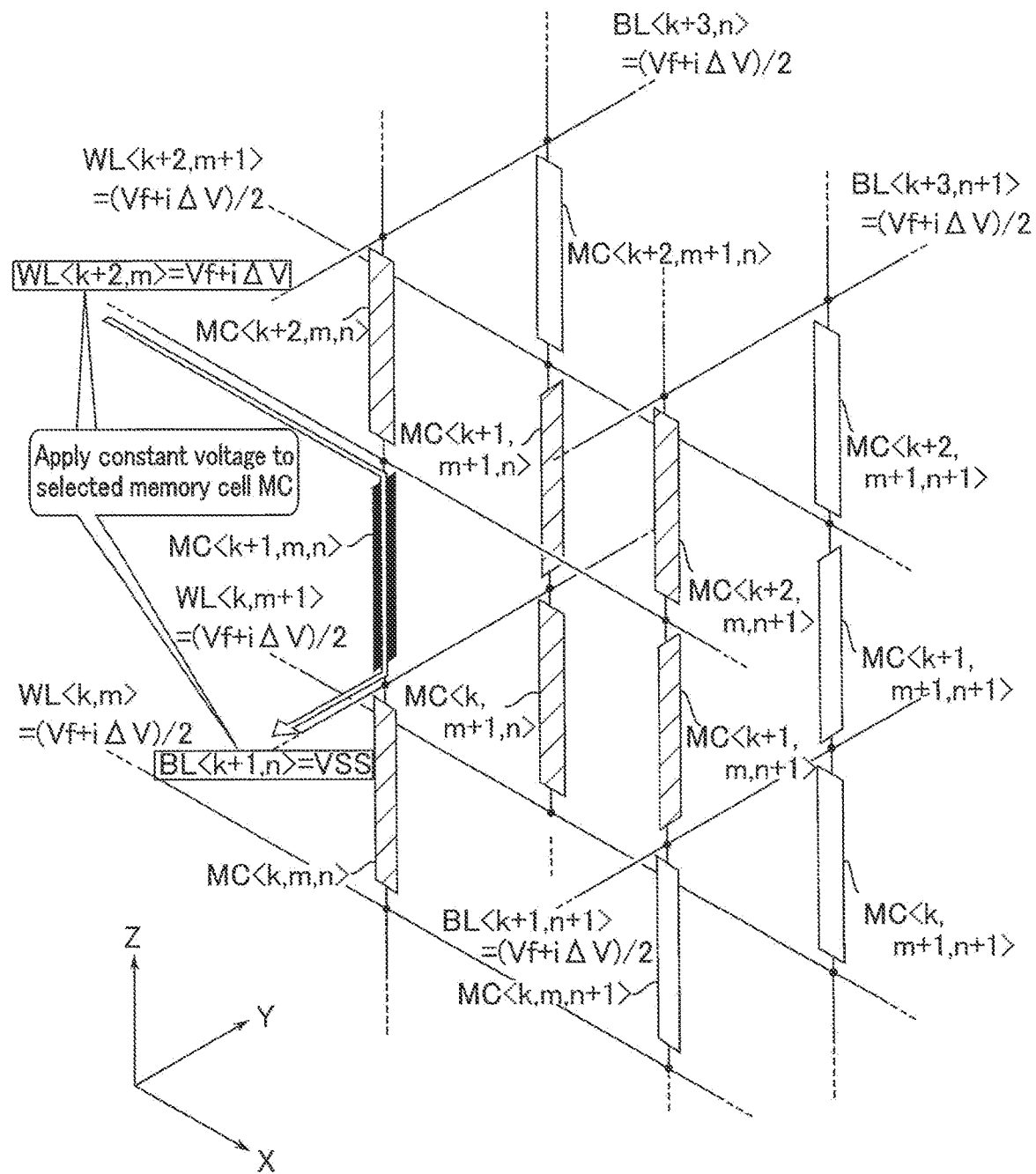
FIG. 13 is a schematic diagram illustrating the resistance increasing operation in the magnetic memory device according to the embodiment.

FIG. 13 is a schematic diagram illustrating the resistance increasing operation in the magnetic memory device according to the embodiment. FIG. 13 assumes that a memory cell MC<k+1,m,n> corresponds to a defective memory cell MC, and that a pair of address information <k+2,m> on a word line WL<k+2,m> and address information <k+1,n> on a bit line BL<k+1,n> is stored in the defective memory cell table 5 in such a manner that this pair is correlated with the defective memory cell MC<k+1,m,n>.

As shown in FIG. 13, when the memory cell MC<k+1/m,n> is selected as the defective memory cell MC which is a target for resistance increase, a pair of a selected word line WL and a selected bit line BL corresponds to a word line WL<k+2,m< and a bit line BL<k+1,n>.

The row selection circuit 11 and the column selection circuit 12 apply the voltage (Vf+iΔV) to the selected word line WL<k+2,m<, and apply the voltage VSS to the selected bit line BL<k+1,n>. This causes a potential difference |Vf+iΔV| in the selected memory cell MC<k+1,m,n>, thereby enabling the switching element SEL within the selected memory cell MC to be increased in resistance.

Furthermore, the row selection circuit 11 and the column selection circuit 12 apply the voltage (Vf+iΔV)/2 to all of the word lines WL other than the selected word line WL and all of the bit lines BL other than the selected word line BL. Accordingly, among the illustrated memory cells MC, the memory cells MC<k+2,m,n>, MC<k+2,m,n+1>, MC<k+1,m+1,n>, MC<k+1,m,n+1>, MC<k,m+1,n> and MC<k,m,n> have the occurrence of a potential difference |Vf+iΔV|/2, thereby entering a semi-selected state. However, the potential difference |Vf+iΔV|/2 is sufficiently small to that the switching element SEL is not increased in resistance. This prevents a normal switching element SEL within semi-selected memory cells MC from unintentionally increasing in resistance.

Among the illustrated memory cells MC, memory cells MC<k+2,m+1,n>, MC<k+2,m+1,n+1>, MC<k+1,m+1,n+1>, MC<k,m,n+1>, and MC<k,m+1,n+1> have no occurrence of a potential difference, thereby entering a non-selected state. This prevents a normal switching element SEL within non-selected memory cells MC from unintentionally increasing in resistance.

By the magnetic memory device 2 operating as described in the above, the selected memory cell MC<k+1,m,n> can selectively be increased in resistance during the resistance increasing operation.

1.3. Advantageous Effects of Present Embodiment

According to the embodiment, the control circuit 18 selects a memory cell MC whose switching element SEL is determined to be defective in the resistance increasing operation. The row selection circuit 11 and the column selection circuit 12 apply a voltage Vf+iΔV while incrementing the variable i until the resistance value of the selected memory cell MC concerned becomes the threshold value Rth or greater. The threshold value Rth is set to a value that is more than three orders of magnitude higher than the resistance value of the short-circuited switching element SEL. By this, the short-circuited switching element SEL can be increased in resistance to such a value that it is deemed to be disconnected. While the short-circuited switching element SEL always enters an ON state, the switching element SEL increased in resistance can always be deemed to be in an OFF state. Thus, in the access operation in which an access target is another memory cell MC, a current can be prevented from flowing through a defective memory cell MC. This can reduce the number of unusable memory cells MC.

Furthermore, in the resistance increasing operation, the voltage Vf+iΔV is applied as a constant voltage to the selected memory cell MC. This makes it possible to apply a potential difference necessary for disconnecting the switching element SEL. As an additional note, in the write operation, a voltage for the current Ic0 or Ic1 to flow as a constant current is applied to the selected memory cell MC. According to such a constant-current control, the memory cell MC including the short-circuited switching element SEL undesirably allows a large amount of current to flow therethrough even with a low voltage, thereby causing difficulty in applying such a voltage to the memory cell MC concerned that the switching element SEL can be disconnected. According to the embodiment, the control circuit 18 applies the voltage Vf+iΔV to the selected memory cell MC by adopting constant voltage control. By this, a current of a magnitude sufficient to disconnect the short-circuited switching element SEL can be applied to the short-circuited switching element SEL.

Furthermore, the row selection circuit 11 and the column selection circuit 12 apply a voltage (Vf+iΔV)/2 to semi-selected memory cells MC while incrementing the variable i. The voltage (Vf+iΔV)/2 is set to such a value that the switching element SEL is not unintentionally disconnected. Thus, the defective switching element SEL within the selected memory cell MC can selectively be disconnected without disconnecting a normal switching element SEL within the semi-selected memory cell MC.

The row selection circuit 11 and the column selection circuit 12 apply the voltage VSS to the non-selected memory cells MC regardless of the variable i. This enables the defective switching element SEL within the selected memory cell MC to selectively be disconnected without disconnecting the normal switching element SEL within the non-selected memory cell MC.

When the number of times the magnetic memory device 2 performs the access operation becomes the threshold value Nth or greater, the memory controller 3 issues a scan command and sends it to the magnetic memory device 2. Upon receipt of the scan command, the magnetic memory device executes the scan operation and specifies a defective memory cell MC. The memory controller 3 in receipt of a notification of address information on the specified defective memory cell MC issues a resistance increasing command including the address information on the defective memory cell MC, and sends the resistance increasing command to the magnetic memory device. Upon receipt of the resistance increasing command, the magnetic memory device executes the resistance increasing operation. This enables the memory system 1 to periodically increase a resistance of the defective memory cell MC as the frequency of use increases. Thus, the number of unusable memory cells MC can be suppressed.

2. Modification

Various modifications are applicable to the embodiment described in the above.

2.1. First Modification

In the case descried in the aforementioned embodiment, the defective memory cell MC specified in the scan operation is selectively increased in resistance. However, this is not a limitation. For example, the resistance increasing operation may be executed without being based on a result of the scan operation. Furthermore, the resistance increasing operation may be executed on the plurality of memory cells MC at once.

Figure 14:
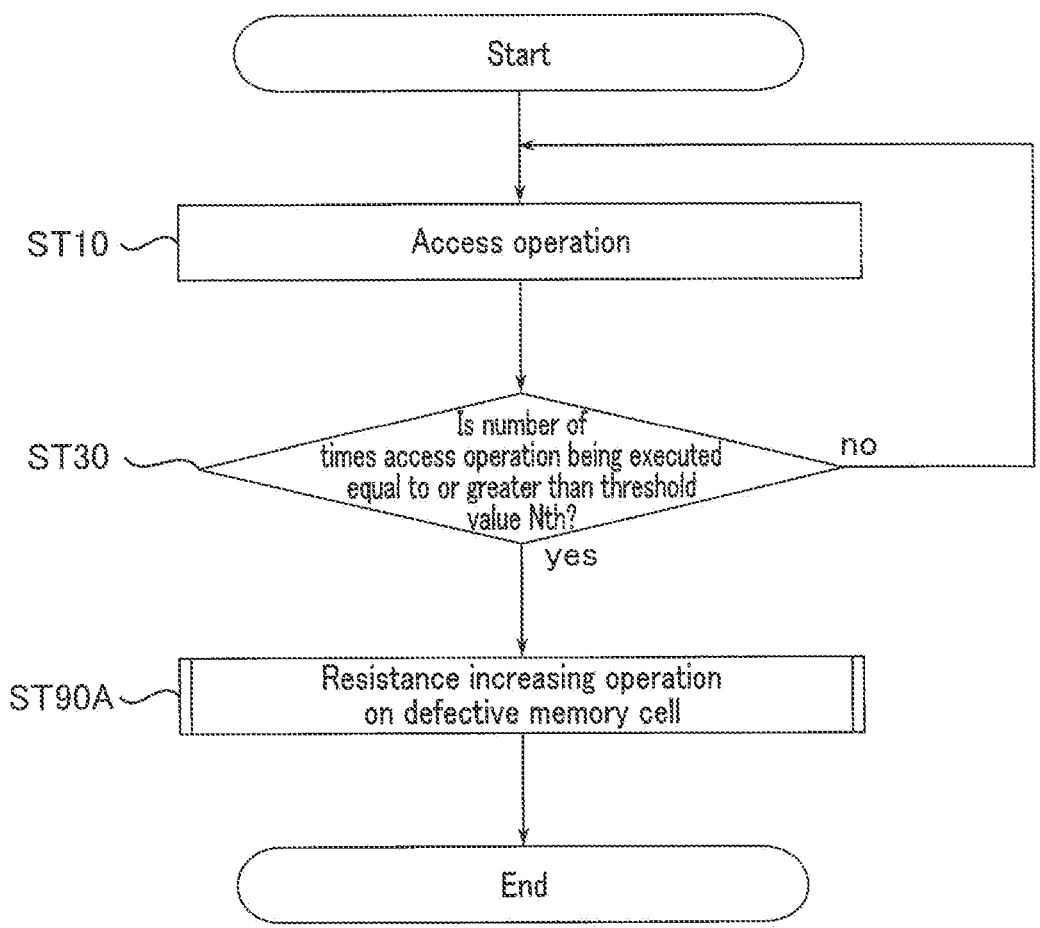
FIG. 14 is a flowchart illustrating a series of operations in a magnetic memory device according to a first modification of the embodiment.

FIG. 14 is a flowchart illustrating a series of operations until a defective memory cell within the magnetic memory device according to a first modification of the embodiment is increased in resistance, and corresponds to FIG. 7 showing the embodiment. In FIG. 14, steps ST50 and ST70 described with reference to FIG. 7 are omitted, and step ST90A is executed instead of step ST90.

As shown in FIG. 14, in step ST10, upon receipt of the access command from the memory controller 3, the magnetic memory device 2 executes the access operation.

In step ST30, the memory controller 3 determines whether or not the number of times the access operation is executed is equal to or greater than a threshold value Nth. If the number of times the access operation is executed is equal to or greater than the threshold value Nth (step ST30; Yes), the processing proceeds to step ST90A. If the number of times the access operation is executed is smaller than the threshold value Nth (step ST30; No), the processing returns to step ST10.

In step ST90A, the memory controller 3 issues the resistance increasing command and transmits it to the magnetic memory device 2. The resistance increasing command in step ST90A does not contain, e.g., address information on the defective memory cell MC. Upon receipt of the resistance increasing command from the memory controller 3, the magnetic memory device 2 executes the resistance increasing operation on the defective memory cell MC.

This is the end of the series of operations that are taken until the defective memory cell MC within the magnetic memory device 2 is increased in resistance.

Figure 15:
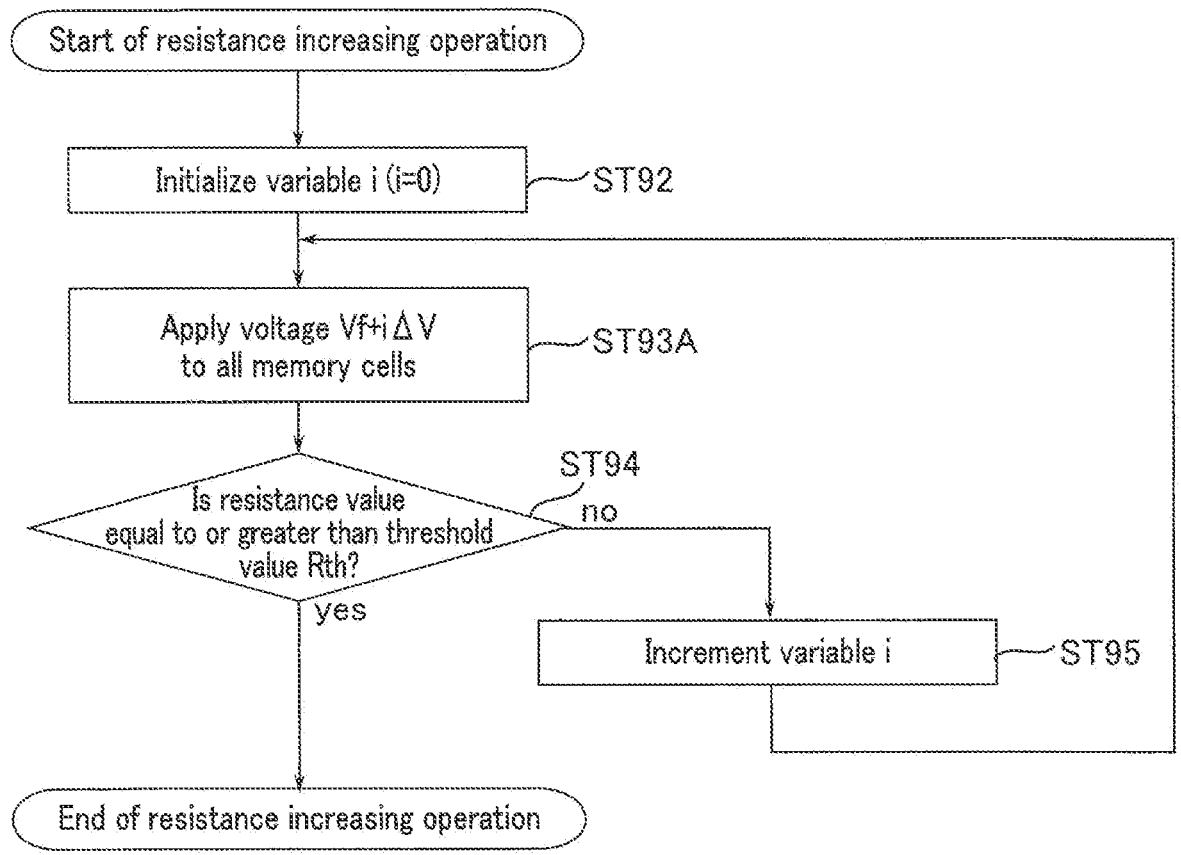
FIG. 15 is a flowchart illustrating a resistance increasing operation in the magnetic memory device according to the first modification of the embodiment.

FIG. 15 is a flowchart illustrating the resistance increasing operation in the magnetic memory device according to the first modification of the embodiment, and corresponds to FIG. 11 showing the embodiment. In FIG. 15, steps ST91 and ST96 described with reference to FIG. 11 are omitted, and step ST93A is executed instead of step ST93.

In step ST92, the control circuit 18 initializes the variable i to "0" (i=0).

In step ST93A, the row selection circuit 11 and the column selection circuit 12 apply a voltage (Vf+iΔV) to all selected memory cells MC. For example, the row selection circuit 11 and the column selection circuit 12 apply the voltage (Vf+iΔV) to all word lines WL, and apply the voltage VSS to all bit lines BL. As described in the above, since the voltage (Vf+iΔV) takes a value that is sufficiently smaller than the threshold voltage Vth of switching elements SEL, a normal switching element SEL enters an OFF state. Accordingly, a current does not flow through a normal memory cell MC. On the other hand, a large amount of current by the aforementioned voltage (Vf+ΔV) flows through a short-circuited switching element SEL, so that the switching element SEL can be increased in resistance.

In step ST94, the control circuit 18 calculates a resistance value based on a current that flows through all memory cells MC in step ST93, and determines whether or not the resistance value is equal to or greater than a threshold value Rth. When the resistance value of the memory cells MC is smaller than the threshold value Rth (step ST94; No), the processing proceeds to step ST95. If the resistance value of the memory cells MC is equal to or greater than the threshold value Rth (step ST94; Yes), the processing is terminated.

In step ST95, the control circuit 18 increments the variable i and returns to the processing in step ST93A. In this manner, a voltage that is stepped up by ΔV is applied to all memory cells MC until it is determined that a calculated resistance value becomes the threshold value Rth or greater (that is, until all defective memory cells MC that are present in all memory cells MC are increased in resistance).

By the magnetic memory device 2 operating as described in the above, the resistance increasing operation can be executed on all of the defective memory cells MC at once within the memory cell array 10.

2.2. Second Modification

In the case described in the above embodiment, constant voltage is repeatedly applied to a defective memory cell MC while stepping up the constant voltage during the resistance increasing operation. However, this is not a limitation. For example, at the time of the resistance increasing operation, the same-value voltage (without being stepped up) may be repeatedly applied to a defective memory cell MC.

FIG. 16 is a flowchart illustrating the resistance increasing operation in the magnetic memory device according to a second modification of the embodiment, and corresponds to FIG. 11 showing the embodiment. In FIG. 16, steps ST92 and ST95 described with reference to FIG. 11 are omitted, and step ST93B is executed instead of step ST93.

In step ST91, upon receipt of the resistance increasing command, the control circuit 18 selects, based on address information on a defective memory cell MC included in the received resistance increasing command, the defective memory cell MC as a target for resistance increase.

In step ST93B, the row selection circuit 11 and the column selection circuit 12 apply a voltage Vf to the selected memory cell MC. For example, the row selection circuit 11 and the column selection circuit 12 apply the voltage Vf to a selected word line WL, and apply the voltage VSS to a selected bit line BL.

In step ST94, the control circuit 18 calculates a resistance value based on a current that flows through the selected memory cell MC in step ST93B, and determines whether or not the resistance value is equal to or greater than the threshold value Rth. When it is determined that the resistance value of the selected memory cell MC is equal to or greater than the threshold value Rth (step ST94; Yes), the processing proceeds to step ST96. When it is determined that the resistance value of the selected memory cell MC is smaller than the threshold value Rth (step ST94; No), the processing returns to step ST93B. In this manner, the constant voltage Vf is applied to the selected memory cell MC until it is determined that the resistance value of the selected memory cell MC becomes the threshold value Rth or greater.

In step ST96, the control circuit 18 determines whether or not all defective memory cells MCV have been selected. When it is determined that there is a defective memory cell MC not selected (step ST96; No), the processing returns to step ST91. In this manner, steps ST91, ST93B, ST94, and ST96 are repeated until the resistance values of all defective memory cells MC exceed the threshold value Rth. On the other hand, when it is determined that all defective memory cells MC have been selected (step ST96; Yes), the processing is terminated.

By the magnetic memory device 2 operating as described in the above, the resistance increasing operation is terminated.

3. Others

In the case described in the above embodiment, the scan operation and the resistance increasing operation are executed after the access operation is executed a predetermined number of times. However, this is not a limitation. For example, the memory controller 3 may periodically execute the scan operation and the resistance increasing operation or may execute them when the magnetic memory device 2 (or the memory system 1) is started up. In the case of periodically executing the scan operation and the resistance increasing operation, the memory controller 3 may issue a command for a new scan operation and resistance increasing operation when, for example, a time period elapses after the last execution of the scan operation and the resistance increasing operation becomes a threshold value or greater.

The scan operation and the resistance increasing operation may be executed during manufacturing of the magnetic memory device 2 (for example, before shipment of the magnetic memory device 2 and after completion of a chip burn-in test with respect to the magnetic memory device 2). When the scan operation and the resistance increasing operation are executed during manufacturing of the magnetic memory device 2, the scan command and the resistance increasing command may be issued by, e.g., a tester (not shown).

In the case described in the above first modification, the resistance increasing operation is executed on all memory cells MC at once. However, this is not a limitation. For example, the resistance increasing operation may be executed at once on a part of the memory cells MC within the memory cell array 10, for example, in units of layers, in units of columns, in units of rows, etc. More specifically, in the case of executing the resistance increasing operation at once in, for example, units of layers, the voltage Vf+ΔV is applied to all interconnects (word lines WL or bit lines BL) above the memory cells MC belonging to a layer which is a target for resistance increase, and the voltage VSS is applied to all interconnects below the memory cells MC belonging to the aforementioned layer. This enables the voltage Vf+iΔV to be applied to all memory cells MC belonging to a layer which is a target for resistance increase, while applying the voltage VSS to all memory cells belonging to all of the other layers. By the magnetic memory device 2 operating as described in the above, the resistance increasing operation which is executed at once in units of layers can be executed.

In the case described in the above embodiment and modifications, the resistance increasing operation determines whether or not a resistance value of a selected memory cell MC is equal to or greater than a threshold value. However, this is not a limitation. For example, the memory controller 3 may determine whether or not a value of a current flowing through a selected memory cell MC is smaller than a threshold value. The threshold value set in this case may be set to a value that is, for example, about three orders of magnitude smaller than a current flowing in a memory cell MC containing a short-circuited switching element SEL.

In the case described in the above embodiment and modifications, the scan operation adopts constant voltage control in which a defective memory cell MC is specified by applying the voltage Varb. However, this is not a limitation, and the scan operation may adopt a constant current control. In such a case, a determination operation for specifying a defective memory cell MC may make a determination depending on whether a voltage of a predetermined magnitude has been applied or not.

In the memory cells MC described in the above embodiment and modifications, a magnetoresistance effect element MTJ is provided below a switching element SEL. However, the magnetoresistance effect element MTJ may be provided above the switching element SEL. Furthermore, a magnetoresistance effect element MTJ and a switching element SEL may be formed in such a manner that their upper and lower relationship is reverse between the case of an odd-numbered layer address k and the case of an even-numbered layer address k.

The magnetoresistance effect element MTJ described in the above embodiment and modifications has a top-free structure in which the storage layer SL is provided above the reference layer RL. However, this is not a limitation. For example, the magnetoresistance effect element MTJ may have a bottom-free structure in which the storage layer SL is provided below the reference layer RL. In such a case, a write current for data "1" and data "0" has a reverse direction to that of a write current for data "1" and data "0" in the case of the top-free structure shown in FIG. 5.

While certain embodiments have been described, these embodiments have been presented by way of example only, and are not intended to limit the scope of the inventions. Indeed, the embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit.

The invention claimed is:

1. A magnetic memory device comprising:
a first memory cell; and
a control circuit,
wherein:
the first memory cell includes a first magnetoresistance effect element and a first switching element coupled in series;

the control circuit is configured to repeatedly apply a first voltage to the first memory cell until a first condition is satisfied in a first operation;

the first memory cell is coupled between a first interconnect and a second interconnect;

the magnetic memory device further comprises a second memory cell coupled between the first interconnect and a third interconnect;

the second memory cell includes a second magnetoresistance effect element and a second switching element coupled in series; and the control circuit is configured to repeatedly apply a second voltage that is smaller than the first voltage to the second memory cell until the first condition is satisfied in the first operation.

2. The magnetic memory device according to claim 1, wherein the control circuit is configured to repeatedly apply the first voltage to the first memory cell while stepping up the first voltage until the first condition is satisfied in the first operation.

3. The magnetic memory device according to claim 1, wherein the first condition includes a resistance value of the first memory cell becoming at least a first threshold value.

4. The magnetic memory device according to claim 1, wherein the first voltage is set independently of a resistance value of the first memory cell.

5. The magnetic memory device according to claim 1, wherein:

the magnetic memory device further comprises a third memory cell coupled between the third interconnect and a fourth interconnect;

the third memory cell includes a third magnetoresistance effect element and a third switching element coupled in series; and the control circuit is configured to repeatedly apply a third voltage that is smaller than the second voltage to the third memory cell until the first condition is satisfied in the first operation.

6. The magnetic memory device according to claim 5, wherein the second voltage is a median value between the first voltage and the third voltage.

7. The magnetic memory device according to claim 5, wherein the third voltage is set independently of the first voltage and the second voltage.

8. A magnetic memory device comprising:

a first memory cell coupled between a first interconnect and a second interconnect;

a second memory cell coupled between the first interconnect and a third interconnect;

a third memory cell coupled between the third interconnect and a fourth interconnect; and a control circuit, wherein:

the first memory cell includes a first magnetoresistance effect element and a first switching element coupled in series, the second memory cell includes a second magnetoresistance effect element and a second switching element coupled in series, the third memory cell includes a third magnetoresistance effect element and a third switching element coupled in series, and the control circuit is configured to repeatedly apply a first voltage to each of the first memory cell, the second memory cell, and the third memory cell until a first condition is satisfied in a first operation.

9. The magnetic memory device according to claim 8, wherein the first condition includes a resistance value based on the first memory cell, the second memory cell, and the third memory cell being at least a threshold value.

10. The magnetic memory device according to claim 1, wherein the control circuit is configured to execute the first operation upon receipt of a first command.

11. A memory system comprising:

a memory controller; and a magnetic memory device including a memory cell array containing a plurality of memory cells, and a control circuit, wherein:

each of the memory cells includes a magnetoresistance effect element and a switching element coupled in series, the control circuit is configured to, upon receipt of a first command from the memory controller, repeatedly apply a first voltage to a first memory cell among the plurality of memory cells and repeatedly apply a second voltage that is smaller than the first voltage to a second memory cell among the plurality of memory cells, until a first condition is satisfied, the first memory cell is coupled between a first interconnect and a second interconnect, and the second memory cell is coupled between the first interconnect and a third interconnect.

12. The memory system according to claim 11, wherein:

the memory controller is configured to issue a second command when a second condition is satisfied, and the control circuit is configured to, upon receipt of the second command from the memory controller:

specify the first memory cell among the plurality of memory cells; and output address information on the specified first memory cell to the memory controller.

13. The memory system according to claim 12, wherein the first command includes address information on the first memory cell.

14. The memory system according to claim 12, wherein the second condition includes a number of times a write operation or a read operation of data with respect to the magnetic memory device is executed becoming at least a second threshold value.

15. The memory system according to claim 12, wherein the second condition includes the magnetic memory device being started up.

16. The memory system according to claim 12, wherein the second condition includes a predetermined period having elapsed from issuance of a previous second command just before the second command.

* * * * *